(12) United States Patent
Dwilinski et al.

(10) Patent No.: US 7,811,380 B2
(45) Date of Patent: *Oct. 12, 2010

(54) PROCESS FOR OBTAINING BULK MONO-CRYSTALLINE GALLIUM-CONTAINING NITRIDE

(75) Inventors: Robert Dwilinski, Warsaw (PL); Roman Doradzinski, Warsaw (PL); Jerzy Garczynski, Lomianki (PL); Leszek Sierzputowski, Union, NJ (US); Yasuo Kanbara, Anan (JP)

(73) Assignees: Ammono Sp. z o.o., Warsaw (PL); Nichia Corporation, Anan-shi (JP)

( * ) Notice: Subject to any disclaimer, the term of this patent is extended or adjusted under 35 U.S.C. 154(b) by 756 days.

This patent is subject to a terminal disclaimer.

(21) Appl. No.: 10/537,804

(22) PCT Filed: Dec. 11, 2003

(86) PCT No.: PCT/JP03/15904

§ 371 (c)(1),
(2), (4) Date: Jun. 7, 2005

(87) PCT Pub. No.: WO2004/053206

PCT Pub. Date: Jun. 24, 2004

(65) Prior Publication Data

US 2006/0037530 A1    Feb. 23, 2006

(30) Foreign Application Priority Data

| Dec. 11, 2002 | (PL) | ..... 357697 |
| Dec. 11, 2002 | (PL) | ..... 357698 |
| Dec. 11, 2002 | (PL) | ..... 357699 |
| Dec. 11, 2002 | (PL) | ..... 357700 |
| Dec. 11, 2002 | (PL) | ..... 357701 |
| Dec. 11, 2002 | (PL) | ..... 357702 |
| Dec. 11, 2002 | (PL) | ..... 357703 |
| Dec. 11, 2002 | (PL) | ..... 357705 |

(51) Int. Cl.
*C30B 11/04*    (2006.01)

(52) U.S. Cl. ............ 117/11; 117/81; 117/83; 117/68; 117/73; 117/74; 117/76; 117/77; 117/78; 117/952

(58) Field of Classification Search ........ 117/11, 117/81, 83, 68, 73–74, 76–78, 952; 257/615; 422/245.1; 438/230

See application file for complete search history.

(56) References Cited

U.S. PATENT DOCUMENTS

| 5,096,860 | A | 3/1992 | Nadkarni |
| 5,147,623 | A | 9/1992 | Eun et al. |
| 5,156,581 | A | 10/1992 | Chow |
| 5,190,738 | A | 3/1993 | Parent |
| 5,306,662 | A | 4/1994 | Nakamura et al. |
| 5,456,204 | A | 10/1995 | Dimitrov et al. |
| 5,589,153 | A | 12/1996 | Garces |
| 5,679,965 | A | 10/1997 | Schetzina |
| 5,780,876 | A | 7/1998 | Hata |
| 5,868,837 | A | 2/1999 | DiSalvo et al. |
| 5,928,421 | A | 7/1999 | Yuri et al. |
| 5,981,980 | A | 11/1999 | Miyajima et al. |
| 6,031,858 | A | 2/2000 | Hatakoshi et al. |
| 6,046,464 | A | 4/2000 | Schetzina |
| 6,051,145 | A | 4/2000 | Griffith et al. |
| 6,067,310 | A | 5/2000 | Hashimoto et al. |
| 6,139,628 | A | 10/2000 | Yuri et al. |
| 6,153,010 | A | 11/2000 | Kiyoku et al. |
| 6,156,581 | A | 12/2000 | Vaudo et al. |
| 6,172,382 | B1 | 1/2001 | Nagahama |
| 6,177,057 | B1 | 1/2001 | Purdy |
| 6,177,292 | B1 | 1/2001 | Hong et al. |
| 6,248,607 | B1 | 6/2001 | Tsutsui |
| 6,249,534 | B1 | 6/2001 | Itoh et al. |
| 6,252,261 | B1 | 6/2001 | Usui |
| 6,258,617 | B1 | 7/2001 | Nitta et al. |
| 6,265,322 | B1 | 7/2001 | Anselm et al. |
| 6,270,569 | B1 | 8/2001 | Shibata et al. |
| 6,303,403 | B1 | 10/2001 | Sato et al. |
| 6,316,785 | B1 | 11/2001 | Nunoue et al. |
| 6,329,215 | B1 | 12/2001 | Porowski et al. |
| 6,355,497 | B1 | 3/2002 | Romano et al. |

| | | |
|---|---|---|
| 6,362,496 B1 | 3/2002 | Nanishi et al. |
| 6,372,041 B1 | 4/2002 | Cho et al. |
| 6,399,500 B1 | 6/2002 | Porowski et al. |
| 6,399,966 B1 | 6/2002 | Tsuda |
| 6,423,984 B1 | 7/2002 | Kato |
| 6,447,604 B1 | 9/2002 | Flynn et al. |
| 6,459,712 B2 | 10/2002 | Tanaka et al. |
| 6,468,882 B2 | 10/2002 | Motoki |
| 6,475,277 B1 | 11/2002 | Hirota et al. |
| 6,488,767 B1 | 12/2002 | Xu et al. |
| 6,509,651 B1 | 1/2003 | Matsubara |
| 6,531,072 B1 | 3/2003 | Suda et al. |
| 6,534,795 B2 | 3/2003 | Hori et al. |
| 6,586,762 B2 | 7/2003 | Kozaki |
| 6,592,663 B1 | 7/2003 | Sarayama et al. |
| 6,593,589 B1 | 7/2003 | Osinski et al. |
| 6,596,079 B1 | 7/2003 | Vaudo et al. |
| 6,614,824 B2 | 9/2003 | Tsuda |
| 6,627,552 B1 | 9/2003 | Nishio et al. |
| 6,639,925 B2 | 10/2003 | Niwa et al. |
| 6,653,663 B2 | 11/2003 | Ishida |
| 6,654,225 B2 | 11/2003 | Takayanagi |
| 6,656,615 B2 | 12/2003 | Dwilinski et al. |
| 6,677,619 B1 | 1/2004 | Nagahama et al. |
| 6,686,608 B1 | 2/2004 | Takahira |
| 6,693,935 B2 | 2/2004 | Tojo et al. |
| 6,711,191 B1 | 3/2004 | Kozaki |
| 6,720,586 B1 | 4/2004 | Kidoguchi |
| 6,749,819 B2 | 6/2004 | Otsuka et al. |
| 6,858,882 B2 | 2/2005 | Tsuda |
| 6,924,512 B2 | 8/2005 | Tsuda |
| 7,053,413 B2 | 5/2006 | D'Evelyn et al. |
| 7,057,211 B2 | 6/2006 | Dwilinski et al. |
| 7,081,162 B2 | 7/2006 | Dwilinski et al. |
| 7,097,707 B2 | 8/2006 | Xu |
| 7,132,730 B2 | 11/2006 | Dwilinski et al. |
| 7,160,388 B2 | 1/2007 | Dwilinski et al. |
| 7,252,712 B2 | 8/2007 | Dwilinski et al. |
| 7,291,544 B2 | 11/2007 | D'Evelyn et al. |
| 7,314,517 B2 | 1/2008 | Dwilinski et al. |
| 7,315,599 B1 | 1/2008 | Morriss |
| 7,335,262 B2 | 2/2008 | Dwilinski et al. |
| 7,364,619 B2 | 4/2008 | Dwilinski et al. |
| 7,374,615 B2 | 5/2008 | Dwilinski et al. |
| 7,387,677 B2 | 6/2008 | Dwilinski et al. |
| 7,410,539 B2 | 8/2008 | Dwilinski et al. |
| 7,420,261 B2 | 9/2008 | Dwilinski et al. |
| 7,422,633 B2 | 9/2008 | Dwilinski et al. |
| 2001/0008656 A1 | 7/2001 | Tischler et al. |
| 2001/0015437 A1 | 8/2001 | Ishii et al. |
| 2001/0022154 A1 | 9/2001 | Cho et al. |
| 2001/0030328 A1 | 10/2001 | Ishida |
| 2002/0011599 A1 | 1/2002 | Motoki et al. |
| 2002/0014631 A1 | 2/2002 | Iwata |
| 2002/0028564 A1 | 3/2002 | Motoki et al. |
| 2002/0031153 A1 | 3/2002 | Niwa |
| 2002/0047113 A1 | 4/2002 | Ohno |
| 2002/0063258 A1 | 5/2002 | Motoki |
| 2002/0078881 A1 | 6/2002 | Cuomo |
| 2002/0189531 A1 | 12/2002 | Dwilinski et al. |
| 2002/0192507 A1 | 12/2002 | Dwilinski et al. |
| 2003/0001238 A1 | 1/2003 | Ban |
| 2003/0003770 A1 | 1/2003 | Morita et al. |
| 2003/0022028 A1 | 1/2003 | Koike et al. |
| 2003/0143771 A1 | 7/2003 | Kidoguchi et al. |
| 2003/0209191 A1 | 11/2003 | Purdy |
| 2004/0003495 A1 | 1/2004 | Xu |
| 2004/0031978 A1 | 2/2004 | D'Evelyn et al. |
| 2004/0089221 A1 | 5/2004 | Dwilinski et al. |
| 2004/0139912 A1 | 7/2004 | Dwilinski |
| 2004/0238810 A1 | 12/2004 | Dwilinski et al. |
| 2004/0244680 A1 | 12/2004 | Dwilinski et al. |
| 2004/0251471 A1 | 12/2004 | Dwilinski et al. |
| 2004/0255840 A1 | 12/2004 | Dwilinski et al. |
| 2004/0261692 A1 | 12/2004 | Dwilinski et al. |
| 2005/0087124 A1 | 4/2005 | Dwilinski et al. |
| 2005/0249255 A1 | 11/2005 | Dwilinski et al. |
| 2006/0032428 A1 | 2/2006 | Dwilinski et al. |
| 2006/0054075 A1 | 3/2006 | Dwilinski et al. |
| 2006/0054076 A1 | 3/2006 | Dwilinski et al. |
| 2006/0057749 A1 | 3/2006 | Dwilinski et al. |
| 2006/0124051 A1 | 6/2006 | Yoshioka et al. |
| 2006/0138431 A1 | 6/2006 | Dwilinski et al. |
| 2006/0177362 A1 | 8/2006 | D'Evelyn et al. |
| 2006/0191472 A1 | 8/2006 | Dwilinski et al. |
| 2007/0234946 A1 | 10/2007 | Hashimoto et al. |
| 2008/0050855 A1 | 2/2008 | Dwilinski et al. |
| 2008/0067523 A1 | 3/2008 | Dwilinski et al. |
| 2008/0102016 A1 | 5/2008 | Hashimoto |
| 2008/0108162 A1 | 5/2008 | Dwilinski et al. |
| 2008/0156254 A1 | 7/2008 | Dwilinski et al. |
| 2008/0303032 A1 | 12/2008 | Dwilinski et al. |
| 2009/0072352 A1 | 3/2009 | Hashimoto et al. |

FOREIGN PATENT DOCUMENTS

| | | |
|---|---|---|
| CN | 1036414 | 10/1989 |
| CN | 1289867 | 4/2001 |
| CN | 1065289 | 5/2001 |
| CN | 1260409 | 6/2006 |
| EP | 0 716 457 | 6/1996 |
| EP | 0 711 853 | 9/1999 |
| EP | 0 949 731 | 10/1999 |
| EP | 0 973 207 | 1/2000 |
| EP | 1 088 914 | 4/2001 |
| EP | 1 164 210 A2 | 12/2001 |
| EP | 1 405 936 A1 | 4/2004 |
| EP | 1514958 | 3/2005 |
| EP | 1 616 981 A1 | 1/2006 |
| EP | 1770189 | 4/2007 |
| FR | 2796657 A | 1/2001 |
| GB | 2326160 A | 12/1998 |
| GB | 2 333 521 | 7/1999 |
| JP | 51-41686 | 4/1976 |
| JP | 60-65798 | 4/1985 |
| JP | 2-137287 | 5/1990 |
| JP | 5-183189 | 7/1993 |
| JP | 07-022692 | 3/1995 |
| JP | 7-165498 | 6/1995 |
| JP | 7-249830 | 9/1995 |
| JP | 8-250802 | 9/1996 |
| JP | 9-134878 | 5/1997 |
| JP | 9-508093 | 8/1997 |
| JP | 9-293897 | 11/1997 |
| JP | 10-7496 | 1/1998 |
| JP | 10-70079 | 3/1998 |
| JP | 10-70338 | 3/1998 |
| JP | 10-84161 | 3/1998 |
| JP | 11-54847 | 2/1999 |
| JP | 11-307813 | 11/1999 |
| JP | 11-340573 A | 12/1999 |
| JP | 2000-44400 A | 2/2000 |
| JP | 2000-82863 | 3/2000 |
| JP | 2000-82867 | 3/2000 |
| JP | 2000-216494 | 8/2000 |
| JP | 2000-327495 | 11/2000 |
| JP | 2001-077038 | 3/2001 |
| JP | 2001-85737 | 3/2001 |
| JP | 2001-148510 A | 5/2001 |
| JP | 2001-247399 | 9/2001 |
| JP | 2001-342100 | 12/2001 |
| JP | 2002-026442 | 1/2002 |
| JP | 2002-241112 | 8/2002 |
| JP | 2002-274997 | 9/2002 |
| JP | 2003-40699 | 2/2003 |
| JP | 2003-527296 A | 9/2003 |

| | | |
|---|---|---|
| JP | 2004-168656 | 6/2004 |
| PL | 347918 | 12/2002 |
| PL | 350375 | 5/2003 |
| WO | WO-94/28204 | 12/1994 |
| WO | WO-97/13891 | 4/1997 |
| WO | WO 98/47170 A | 10/1998 |
| WO | WO-98/55671 A1 | 12/1998 |
| WO | WO-01/24284 | 4/2001 |
| WO | WO-01/24921 | 4/2001 |
| WO | WO 01/68955 A1 | 9/2001 |
| WO | WO-02/101120 A | 12/2002 |
| WO | WO-02/101124 A1 | 12/2002 |
| WO | WO-03/035945 | 5/2003 |
| WO | WO-03/043150 A1 | 5/2003 |
| WO | WO-2004/090202 A1 | 10/2004 |

OTHER PUBLICATIONS

M. K. Kelly et al. (1996) "Optical Patterning of GaN Films," Appl Phys. Lett 69(12), pp. 1749-1751.

W. S. Wong et al. (1999) "Fabrication of Thin-Film InGaN Light-Emitting Diode Membranes By Laser Lift-Off," Applied Physics Letters 75(10), pp. 1360-1362.

S. Porowski et al. (1993) "Prospects for High-Pressure Crystal Growth of III-V Nitrides," Inst. Phys. Conf. Ser. No. 137, Chapter 4, pp. 369-372.

Douglas R. Ketchum et al. (2001) "Crystal Growth of Gallium Nitride in Supercritical Ammonia," Journal of Crystal Growth 222, pp. 431-434.

R. Dwiliski et al. (1998) "Ammono Method of BN, AlN and GaN Synthesis and Crystal Growth," MRS Internet J. Nitride Semiconductor Res. 3(25), 4 pages.

Masaichi Yano et al. (1999) "Control of Nucleation Site and Growth Orientation of Bulk GaN Crystals," Jpn. J. Appl. Phys. 38, pp. L1121-L1123.

Dwilinski, R. et al., (May 18, 1998). "Ammono Method of GaN and AlN Production," *Diamond and Related Materials*. 7:1348-1350.

Yamane, H. et al., (Jun. 1998). "Polarity of GaN Single Crystals Prepared with Na Flux," *Japanese Journal of Applied Physics*. 37:3436-3440.

Pakula, K. et al., (1995). "Growth of GaN Metalorganic Chemical Vapour Deposition Layers On GaN Single Crystals," *Acta Physica Polonica A*. 88:861-864.

Dwilinski, R. et al., (1996). "On GaN Crystallization By Ammonothermal Method," *Acta Physica Polonica A*. 90:763-766.

Dwilinski, R. et al., (1997) "Exciton Photo-Luminescence of GaN Bulk Crystals Grown by the Ammono Method," *Materials Science and Engineering*. B50:46-49.

Melnik, Y. et al., (1998), "Properties Of Free-Standing GeN Bulk Crystals Grown By HVPE," *Mat. Res. Soc. Symp. Proc.* 482:269-274.

Balkas, C.M. et al., (1997). "Growth Of Bulk AlN And GaN Single Crystals By Sublimation," *Mat. Res. Soc. Symp. Proc.* 449:41-46.

Porowski, S., (1998). "Bulk and Homoepitaxial GaN-growth and Characterisation," *Journal of Grystal Growth*. 189/190:153-158.

Aoki, M. et al., (2000). "Growth of GaN Single Crystals From a Na-Ga Melt at 750° C. and 5MPa of $N_2$," *Journal of Crystal Growth*. 218:7-12.

Yamane, H. et al., (1998). "Morphology and Characterization of GaN Single Crystals Grown in a Na Flux," *Journal of Crystal Growth*. 186:8-12.

Yamane, H. et al., (Jul. 1, 1998). "Na Flux Growth of GaN Single Crystals," *Journal of the Japanese Association for Crystals Growth*. 25(4):14-18 (with partial English translation).

Waltereit, P. et al., (Aug. 24, 2000) "Nitride Semiconductors Free Of Electrostatic Fields For Efficient White Light-Emitting Diodes," *Letters to Nature*. 406:865-868.

Brandt, O. et al. (Dec. 20, 1999) "Critical Issues For The Growth Of High-Quality (Al,Ga)N/GaN and GaN/(In,Ga)N Heterostructures on SiC(0001) by Molecular-beam Epitaxy," *Applied Physics Letters*. 75(25):4019-4021.

Akasaki, I. et al (1991). "Growth and Properties of Single Crystalline GaN Films by Hydride Vapor Phase Epitaxy," *Crystal Properties and Preparation* 32-34:154-157.

Chu, T. L. et al. (1974). "Crystal Growth and Characterization of Gallium Nitride," *J. Electrochem. Soc.: Solid-State Science and Technology* 121-1:159-162.

Kaschner, A. et al. (1999). "Influence of Doping on the Lattice Dynamics of Gallium Nitride," *MRS Internet J. Nitride Semicond. Res.* 4S1, G3.57; 6 pages.

Kim, S. T. et al. (1998). "Preparation and Properties of Free-standing HVPE Grown GaN Substrates," *Journal of Crystal Growth* 194:37-42.

Kuroda, N. et al. (1998). "Precise Control of Pn-junction Profiles for GaN-based LD structures Using GaN Substrates with Low Dislocation Densities," *Journal of Crystal Growth* 189/190:551-555.

Motoki, K. et al. (2001). "Preparation of Large Freestanding GaN Substrates by Hydride Vapor Phase Epitaxy Using GaAs as a Starting Substrate," *Jpn. J. Appl. Phys.* 40:L140-L143.

Oda, O. et al., (2000) "GaN Bulk Substrates for GaN Based LEDs and LDs" *Physica Status Solidi. (a)* 180(1):51-58.

Kuramata, A. et al. (1996) "Substrates for III-V Nitride Semiconductors," *Oyo Buturi*. 65(9):936-940; with partial English translation.

Hirano, S. et al. (Jan. 1989) "Hydrothermal Synthesis of Gallium Orthophosphate Crystals," *Bull. Chem. Soc. Jpn.* 62:275-278.

Gihodo Press. (1997). "Single Crystal Growth," Chapter 1 in *Hydrothermal Synthesis Handbook*. p. 244-245; 250-255; with partial English translation.

Laudise, R.A. (1991). "What is Materials Chemistry?" Chapter 27 in *Materials for NonLinear Optics: Chemical Perspectives*. American Chemical Society. pp. 410-433.

Sakagami, N. et al., (1974) "Growth Kinetics and Morphology of ZnO Single Crystal Grown under Hydrothermal Conditions," *Journal of the Ceramic Association* 82:405-413; with partial English translation.

Sekiguchi, T. et al., (2000) "Hydrothermal Growth of ZnO Single Crystals and their Optical Characterization," *Journal of Crystal Growth*. 214/215:72-76.

Yanagisawa, K. et al. (1996) "Hydrothermal Single Growth of Calcite in Ammonium Acetate Solution," *Journal of Crystal Growth*. 163:285-294.

Yanagisawa, K. et al. (2001) "Improvement of Quality of Hydrothermally Grown Calcite Single Crystals," *Journals of Crystal Growth*. 229:440-444.

Hirano, S. et al., (1991) "Growth of Gallium Orhophosphate Single Crystals in Acidic Hydrothermal Solutions," *Journal of Materials Science*. 26:2805-2808.

Mao, X. et al., (Jul. 2000) "New Concept Technology—Pressure-Variation Liquid Phase Epitaxy," *SPIE Photonics Taiwan Conference Proceedings*. 12 pages.

Palczewska, M. et al. (Oct. 23, 1998). "Paramagnetic Defects in GaN," *MRS Internet J. Nitride Semicond. Res.* 3(45):1-3.

Grzegory, I., (2001). "High Pressure Growth of Bulk GaN from Sulotions in Gallium" *Journal of Physics: Condensed Matter*. 13(32):6875-6892.

Porowski, S. (1996). "High Pressure Growth of GaN—New Prospects for Blue Lasers," *Journal of Crystal Growth*. 166:583-589.

Penkala, T., (1972). "Zarys Krystalografii" *Basics of Crystallography*. PWN, Warszawa: 349.

Ikornikova, N. I-O. (1975), "Hydrothermal Synthesis of Crystals in Chloride Systems," Izd. Nauka, ed. Moscow: 124-125; 132-133.

Peters, D., (1990). "Ammonothermal Synthesis of Aluminium Nitride," *Journal of Crystal Growth* 104:411-418.

Sangwal, K., ed. (1994). "Growth apparatus" Chapter 10.3 In *Elementary Crystal Growth*. Lublin: 331.

Purdy, A., (1999). "Ammonothermal Synthesis of Cubic Gallium Nitride," Chem. Mater. 11:1648-1651.

Lan, Y.C. et al., (Apr. 14, 2000). "Syntheses and Structure of Nanocrystalline Gallium Nitride Obtained from Ammonothermal Method Using Lithium Metal as Mineralizator," *Materials Research Bulletin* 35:2325-2330.

M. Fukuda (1998) "Optical Demiconductor Devices:" *Wiley Series in Microwave and Optical Engineering*. Chang, K., John Wiley & Sons, Inc. New York. Esp. p. 7.

Sze, S.M. (1998) Modern Semiconductor Device Physics. John Wiley & Sons, Inc. New York. Esp. Appendix G (pp. 539-540).

Inoue, T. et al. (2001) "Growth of Bulk GaN Single Crystals by the Pressure-Controlled Solution Growth Method," *Journal of Crystal Growth*. 229: 35-40.

Chinese Office Action mailed Mar. 3, 2006, directed to corresponding CN Application No. 02821230.4; 8 pages.

Joseph W. Kolis et al. (1998). "Materials Chemistry and Bulk Crystal Growth of Group III Nitrides in Supercritical Ammonia." Mat. Res. Soc. Symp. Proc. vol. 495; 367-372.

U.S. Office Action, mailed Oct. 27, 2008, directed to related U.S. Appl. No. 10/493,594; 23 pages.

U.S. Office Action, mailed Oct. 29, 2008, directed to related U.S. Appl. No. 10/514,429; 11 pages.

Supplementary European Search Report, dated Sep. 23, 2008, European Patent Application No. 02788783.5; 3 pages.

Chinese Office Action, dated Jul. 18, 2008, directed to Chinese Patent Application No. 200580040008.X; 25 pages.

Chinese Office Action, dated Dec. 28, 2007, directed to Chinese Patent Application No. 02802023.5; 8 pages.

Japanese Notification, mailed Mar. 14, 2006, directed to Japanese Patent Application No. 2003-50367; 3 pages.

Japanese Notification of Reason(s) for Refusal, mailed Dec. 16, 2008, directed to Japanese Patent Application No. 2004-505416; 7 pages.

Japanese Notification of Reason(s) for Refusal, mailed Jan. 6, 2009, directed to Japanese Patent Application No. 2004-506101; 7 pages.

International Search Report, mailed May 7, 2004, directed to International Patent Application No. PCT/JP03/15906; 3 pages.

International Search Report, mailed Sep. 29, 2005, directed to International Patent Application No. PCT/JP2005/011091; 3 pages.

International Search Report, mailed Apr. 21, 2006, directed to International Patent Application No. PCT/JP2005/022396; 3 pages.

U.S. Office Action, mailed Oct. 16, 2007, directed to U.S. Appl. No. 10/538,654; 10 pages.

U.S. Office Action, mailed Apr. 2, 2007, directed to U.S. Appl. No. 10/538,407;13 pages.

Song, Y. et al. (2003)."Bulk GaN Single Crystals: Growth Conditions by Flux Method." *Journal of Crystal Growth*.247:275-278.

Beaumont, B. et al. (2001)."Epitaxial Lateral Overgrowth of GaN." *Phys. Stat. Sol.(b)*.227(1);1-43.

Liu, L. et al. (2002). "Substrates for Gallium Nitride Epitaxy." *Reports: A Review Journal, Materials Science and Engineering*:37:61-127.

Yano, M. et al. (2000). "Growth of Nitride Crystals, BN, AlN and GaN by Using a Na Flux" *Diamond and Related Materials*. 9:512-515.

Yamane, H. et al. (Jul. 1, 1998). "Na Flux Growth of GaN Single Crystals" *Journal of the Japanese Association for Crystal Growth*. 25(4):14-18.

Yamane, H. et al. (1998). "Morphology and Characterization of GaN Single Crystals Grown in a Na Flux." *Journal of Crystal Growth*. 186:8-12.

Purdy, a. "Ammonothermal Synthesis of Cubic Gallium Nitride." *American Chemical Society. Chem. Mater*.11(7):1648-1651.

Sangwal, K. (1994)."Growth Apparatus." Chapter 10.3 *In Elementary Crystal Growth*.Lublin:331.

Ikornikova, N. I-O. (1975). "Hydrothermal Synthesis of Crystals in Chloride Systems," Izd. Nauka, ed. Moscow: 124-125; 132-133.

Lan, Y.C. et al., (Apr. 14, 2000). "Syntheses and Structure of Nanocrystalline Gallium Nitride Obtained from Ammonothermal Method Using Lithium Metal as Mineralizator," *Materials Research Bulletin* 35:2325-2330.

Polish Patent Office Notification and Search Report, dated Jan. 15, 2007, directed to Polish Patent Application No. P-347918/DP. 8 pages.

Penkala, T., (1972). "Zarys Krystalografii (Basics of Crystallography)". PWN, Warszawa: 349.

European Office Action mailed on Jul. 2, 2009 directed at application No. 03778841.1; 3 pages.

European Office Action mailed on Jul. 6, 2009 directed at application No. 03733682.3; 4 pages.

Japanese Notification of Reasons for Refusal mailed on Jul. 28, 2009, directed to Japanese Patent Application No. 2003-538438; 6 pages.

European Office Action dated Oct. 21, 2009, directed to related EP Application No. 02 762 734.8; 4 pages.

Japanese Notification of Reasons for Refusal dated Nov. 4, 2009, directed to related JP Application No. 2004-506101; 4 pages.

Chen et al., "Modeling of Ammonothermal Growth of Nitrides", *Journal of Crystal Growth* 258 (2003); pp. 181-187.

Chen et al., "Effects of Baffle Design on Fluid Flow and Heat Tranfer in Ammonothermal Growth of Nitrides", *Journal of Crystal Growth* 266(2004); pp. 271-277.

Yoshikawa et al., "Crystal Growth of GaN by Ammonothermal Method", *Journal of Crystal Growth* 260 (2004); pp. 67-72.

Hashimoto et al., "Growth of Gallium Nitride via Fluid Transparent in Superficial Ammonia", *Journal of Crystal Growth* 257 (2005); pp. e525-e530.

Raghothamachar et al., "Characterization of Bulk Grown GaN and AlN Single Crystal Materials", *Journal of Crystal Growth* 287 (2006), pp. 349-353.

Dwilinski, R. et al., U.S. Office Action mailed Dec. 4, 2009, directed to a related U.S. Appl. No. 11/969,735; 14 pages.

Canadian Office Action, mailed Apr. 2, 2009, directed to Canadian Patent Application No. 2,449,714; 4 pages.

Dwilinski, R. et al., U.S. Office Action, mailed Apr. 28, 2009, directed to a related U.S. Appl. No. 11/969,735; 11 pages.

Japanese Office Action, mailed May 7, 2009, directed to Japanese Patent Application No. 2004-506141; 6 pages.

Japanese Office Action, mailed May 12, 2009, directed to Japanese Patent Application No. 2003-544869; 6 pages.

Japanese Notification of Provision of Relevant Information on Prior Arts, mailed Dec. 24,2008, directed to Japanese Patent Application No. 2004-558483; 14 pages.

Kato, H. et al. (May 28, 1988)."MOVPE Growth of GaN on off-angle sapphire substrate", *IEICE Technical Report*. The Institute of Electronics, Information and Communication Engineers of Japan. Tokyo, Japan. 88(61):9 pages.

Sakai, A. et al., (Oct. 20, 1997). "Defect structure in selectively grown GaN films with low threading dislocation density." *Appl. Phys. Lett.* 71(16):2259-2261.

Dwilinski, R. et al., U.S. Office Action, mailed Sep. 7, 2006, directed to a related U.S. Appl. No. 10/479,857; 18 pages.

Dwilinski, R. et al., U.S. Office Action, mailed Mar. 21, 2007, directed to a related U.S. Appl. No. 10/479,857; 15 pages.

Dwilinski, R. et al., U.S. Office Action, mailed Oct. 17, 2007 directed to a related U.S. Appl. No. 10/479,857; 12 pages.

Dwilinski, R. et al., U.S. Office Action, mailed Nov. 14, 2006, directed to a related U.S. Appl. No. 10/519,141; 5 pages.

Dwilinski, R. et al., U.S. Office Action, mailed Jun. 4, 2007, directed to a related U.S. Appl. No. 10/519,141; 5 pages.

Chinese Office Action, dated Apr. 13, 2007, directed to Chinese Patent Application No. 02802023.5; 9 pages.

Chinese Office Action, dated Apr. 8, 2005, directed to Chinese Patent Application No. 02801950.4; 9 pages.

Chinese Office Action, dated Aug. 5, 2005, directed to Chinese Patent Application No. 02821231.2; 11 pages.

Chinese Office Action, dated Jun. 5, 2009, directed to Chinese Patent Application No. 200580040008.X; 13 pages.

European Search Report, dated Aug. 22, 2007, directed to European Patent Application No. 02775396.1; 3 pages.

Japanese Office Action mailed Dec. 26, 2006, directed to Japanese Patent Application No. 2003-544869; 3 pages (with partial English language translation).

International Search Report, mailed Feb. 18, 2003, directed to International Patent Application No. PCT/IB02/04441; 3 pages.

Dwilinski, R. et al., U.S. Office Action, mailed Mar. 23, 2005, directed to a related U.S. Appl. No. 10/147,319; 7 pages.

Dwilinski, R. et al., U.S. Office Action, mailed Jul. 1, 2004 directed to a related U.S. Appl. No. 10/147,319; 15 pages.

Dwilinski, R. et al., U.S. Office Action, mailed Oct. 19, 2005, directed to a related U.S. Appl. No. 10/147,319; 6 pages.

Dwilinski, R. et al., U.S. Office Action, mailed Mar. 21, 2007, directed to a related U.S. Appl. No. 10/538,349; 6 pages.

Dwilinski, R. et al., U.S. Office Action, mailed Oct. 18, 2007, directed to a related U.S. Appl. No. 10/538,407; 8 pages.

Dwilinski, R. et al., U.S. Office Action, mailed Jun. 10, 2008, directed to a related U.S. Appl. No. 10/514,429; 12 pages.
D'Evelyn, M. et al., U.S. Office Action, mailed Dec. 9, 2004, directed to a related U.S. Appl. No. 10/440,574; 8 pages.
Dwilinski, R. et al., U.S. Office Action, mailed Mar. 24, 2006, directed to a related U.S. Appl. No. 10/493,594; 18 pages.
Dwilinski, R. et al., U.S. Office Action, mailed Apr. 13, 2009, directed to a related U.S. Appl. No. 10/493,594; 22 pages.
Dwilinski, R. et al., U.S. Office Action, mailed Aug. 1, 2007, directed to a related U.S. Appl. No. 10/493,594; 18 pages.
Dwilinski, R. et al., U.S. Office Action, mailed Aug. 2, 2005, directed to a related U.S. Appl. No. 10/493,594; 13 pages.
Dwilinski, R. et al., U.S. Office Action, mailed Dec. 14, 2006, directed to a related U.S. Appl. No. 10/493,594; 17 pages.
Dwilinski, R. et al., U.S. Office Action, mailed Apr. 20, 2006, directed to a related U.S. Appl. No. 10/493,747; 9 pages.
Dwilinski, R. et al., U.S. Office Action, mailed Nov. 4, 2005, directed to a related U.S. Appl. No. 10/493,747; 7 pages.
Dwilinski, R. et al., U.S. Office Action, mailed Apr. 20, 2005, directed to a related U.S. Appl. No. 10/479,807; 8 pages.
Dwilinski, R. et al., U.S. Office Action, mailed Dec. 23, 2005, directed to a related U.S. Appl. No. 10/479,807; 6 pages.
Dwilinski, R. et al., U.S. Office Action, mailed Feb. 17, 2005, directed to a related U.S. Appl. No. 10/479,856; 5 pages.
Dwilinski, R. et al., U.S. Office Action, mailed Jul. 7, 2005, directed to a related U.S. Appl. No. 10/479,856; 5 pages.
Dwilinski, R. et al., U.S. Office Action, mailed May 26, 2006, directed to a related U.S. Appl. No. 10/479,858; 6 pages.
Dwilinski, R. et al., U.S. Office Action, mailed Oct. 4, 2005, directed to a related U.S. Appl. No. 10/479,858; 7 pages.
Dwilinski, R. et al., U.S. Office Action, mailed Apr. 26, 2006, directed to a related U.S. Appl. No. 10/682,891; 6 pages.
Dwilinski, R. et al., U.S. Office Action, mailed Apr. 27, 2005, directed to a related U.S. Appl. No. 10/682,891; 5 pages.
Dwilinski, R. et al., U.S. Office Action, mailed Jul. 10, 2007, directed to a related U.S. Appl. No. 10/682,891; 6 pages.
Dwilinski, R. et al., U.S. Office Action, mailed Sep. 2, 2008, directed to a related U.S. Appl. No. 10/682,891; 6 pages.
Dwilinski, R. et al., U.S. Office Action, mailed Nov. 14, 2006, directed to a related U.S. Appl. No. 10/682,891; 6 pages.
Dwilinski, R. et al., U.S. Office Action, mailed Dec. 27, 2007, directed to a related U.S. Appl. No. 10/682,891; 6 pages.
Dwilinski, R. et al., U.S. Office Action, mailed Oct. 1, 2008, directed to a related U.S. Appl. No. 11/791,716; 7 pages.
Dwilinski, R. et al., U.S. Office Action, mailed Jun. 1, 2009, directed to a related U.S. Appl. No. 11/791,716; 8 pages.

*Primary Examiner*—Robert M Kunemund
*Assistant Examiner*—Matthew J Song
(74) *Attorney, Agent, or Firm*—Morrison & Foerster LLP

(57) ABSTRACT

A process for obtaining bulk mono-crystalline gallium-containing nitride, liminating impurities from the obtained crystal and manufacturing substrates made of bulk mono-crystalline gallium-containing nitride has been now proposed. According to the invention, the process for obtaining of mono-crystalline gallium-containing nitride from the gallium-containing feedstock in a supercritical ammonia-containing solvent with mineralizer addition is characterized in that the feedstock is in the form of metallic gallium and the mineralizer is in the form of elements of Group I and/or their mixtures, and/or their compounds, especially those containing nitrogen and/or hydrogen, whereas the ammonia-containing solvent is in the form of the mineralizer and ammonia, there are two temperature zones in each step of the process, and the feedstock is placed in the dissolution zone, and at least one mono-crystalline seed is deposited in the crystallization zone, and following the transition of the solvent to the supercritical state, the process comprises the first step of transition of the feedstock from the metallic form to the polycrystalline gallium-containing nitride, and the second step of crystallization of the gallium-containing nitride through gradual dissolution of the feedstock and selective crystallization of gallium-containing nitride on at least one mono-crystalline seed at the temperature higher than that of the dissolution of the feedstock, while all the vital components of the reaction system (including the feedstock, seeds and mineralizer) invariably remain within the system throughout the whole process, and consequently bulk mono-crystalline gallium-containing nitride is obtained. The invention relates also the the post-treatment (slicing, annealing and washing) of the thus obtained crystals.

The improved process and the bulk monocrystals obtained thereby are intended mainly for use in the field of optoelectronics.

21 Claims, 8 Drawing Sheets

PROCESS FOR OBTAINING BULK MONO-CRYSTALLINE GALLIUM-CONTAINING NITRIDE

The object of this invention is the process for obtaining bulk mono-crystalline gallium-containing nitride from gallium-containing feedstock, through its crystallization from a supercritical ammonia-containing solvent with addition of a mineralizer. The impurities contained in the product obtained in the process according to the invention are at least partially eliminated and the product is used, for example, as the substrate for expitaxy for manufacturing of opto-electronic devices. The method of eliminating impurities and/or decreasing their level in the bulk mono-crystalline gallium-containing nitride and the method of obtaining substrates made of bulk mono-crystalline gallium-containing nitride are also objects of this invention.

Opto-electronic devices based on Group XIII element nitrides, such as AlN, GaN, are usually manufactured on sapphire or silicon-carbide substrates that differ from the deposited nitride layers (the so-called heteroepitaxy). In the most often used Metallo-Organic Chemical Vapor Deposition (MOCVD) method, the deposition of GaN is performed from ammonia and metallo-organic compounds in a gaseous phase, while the attained growth rates make it impossible to afford bulk layer. The application of a buffer layer reduces the dislocation density, but not more than to approx. $10^8/cm^2$. Another method was proposed for obtaining bulk mono-crystalline gallium nitride. It consists in an epitaxial deposition employing halides in a gaseous phase (Halide Vapor Phase Epitaxy—HVPE) ["Optical patterning of GaN films" M. K. Kelly, O. Ambacher, Appl. Phys. Lett. 69 (12) (1996) and "Fabrication of thin-film InGaN light-emitting diode membranes" W. S. Wrong, T. Sands, Appl. Phys. Lett. 75 (10) (1999)]. This method enables preparation of GaN substrates of a 2-inch diameter. However, their quality is not sufficient for laser diodes, because the dislocation density continues to be approx. $10^7$ to approx. $10^9/cm^2$. Recently, the method of lateral epitaxial growth (ELOG) has been used for the reduction of a dislocation density. In this method the GaN layer is first grown on sapphire substrate and then a layer of $SiO_2$ is deposited on it in the form of strips or grids. On the thus prepared substrate, in turn, the lateral growth of GaN, leading to a dislocation density lowering to approx. $10^7/cm^2$, may be carried out. The growth of bulk crystals of gallium nitride and other metals of Group XIII (IUPAC, 1989) is extremely difficult. Standard methods of crystallization from melt and sublimation methods are not applicable because of the decomposition of the nitrides into metals and $N_2$.

In the HNP method ["Prospects for high-pressure crystal growth of III-V nitrides" S. Porowski et al., Inst. Phys. Conf. Series, 137, 369 (1998)] this decomposition is inhibited by the use of nitrogen under the high pressure. The growth of crystals is carried out in molten gallium, i.e. in the liquid phase, resulting in the production of GaN platelets of approx. 10 mm in size. Sufficient solubility of nitrogen in gallium requires temperature of approx. 1500° C. and pressure of 1500 MPa.

In another known method, the supercritical ammonia was proposed to lower the temperature and decrease the pressure during the growth process. It was shown in particular that it is possible to obtain the crystalline gallium nitride by a synthesis from gallium and ammonia, provided that the latter contains Group I element amides ($KNH_2$ or $LiNH_2$). The processes were conducted at temperature of up to 550° C. and under the pressure of 500 MPa, yielding crystals about 5 µm in size ["AMMONO method of BN, AlN, and GaN synthesis and crystal growth" R. Dwiliniski et al., Proc. EGW-3, Warsaw, Jun. 22-24, 1998, MRS Internet Journal of Nitride Semiconductor Research, http://nsr.mij.mrs.org/3/25].

The use of supercritical ammonia also enables the re-crystallization of gallium nitride from the feedstock consisting of fine-crystalline GaN ["Crystal Growth of gallium nitride in supercritical ammonia" J. W. Kolis et al., J. Cryst. Growth 222, 431-434 (2001)]. The re-crystallization was made possible by an introduction of amide ($KNH_2$) into the supercritical ammonia, along with a small amount of halide (KI). Processes conducted at 400° C. and under the pressure of 340 MPa gave GaN crystals about 0.5 mm in size. However, no chemical transport processes, and in particular no growth on the seeds, were observed in the supercritical solution.

The ammonobasic method for preparing gallium-containing nitride crystals has recently been disclosed in WO 02/101120. The method allows production of gallium-containing nitride mono-crystals crystallized on at least one crystallization seed in the presence of a Group I element-containing compound (Group numbering according to the IUPAC convention of 1989 throughout this application) in a supercritical ammonia-containing solution. As feedstock for growth of desired crystals, gallium-containing nitrides are used. The thus obtained gallium-containing nitride bulk mono-crystals have surface dislocation density lower than surface dislocation density of seeds used in the process. The bulk mono-crystals have sufficient size and regular shape enhancing industrial use of the crystals—among others—as substrates for epitaxy in opto-electronic devices. The major advantage of the discussed method is that it has enabled to lower dislocation density in the thus grown GaN mono-crystalline layers to less than $10^6/cm^2$. Besides, the bulk nitride mono-crystals obtained by that method have high electrical resistivity (in the case of GaN single crystals within a range of several $\Omega\cdot cm$) and high crystalline quality, as demonstrated by a low value of FWHM of the X-ray rocking curve from (0002) plane—less then 60 arcsec for a Cu K α1 beam.

Ammonothermal method for growing gallium nitride crystals on seeds is described in French patent application FR 2 796 657 A. In view of the experiments disclosed in WO 02/101120 and the experience based thereon, according to the teaching contained in the French application, neither temperature distribution of the process can be successfully selected for the effective crystal growth nor the seeds can be effectively protected against dissolution in supercritical solvent without intensive research being done. Moreover, the arrangement of feedstock and seeds, disclosed in the French application FR 2 796 657 A, is disadvantageous.

The lifetime of optical semiconductor devices depends primarily on crystalline quality of the optically active layers, and especially on a surface dislocation density. In the case of GaN-based laser diodes, it is beneficial to lower dislocation density in the GaN substrate layer to less than $10^6/cm^2$, and this is extremely difficult in the methods used so far.

Industrial manufacturing of opto-electronic devices requires the use of standardized templates in the form of a gallium-containing nitride, having a surface area of more than 1 $cm^2$. As the quality and purity requirements for the substrates used for depositing epitaxial semiconductor layers are very high, obtaining such templates by application of the methods used so far is relatively expensive and time-consuming.

Therefore, the main objective of this invention is to develop a new method of obtaining bulk mono-crystalline gallium-containing nitride, free of any limitations which are present in the methods used so far. This objective was achieved through development of the process according to the invention, in which the feedstock and the mineralizer was properly selected and the course of the process was optimized. Moreover, the invention covers the post-treatment of bulk gallium-containing nitride single crystals obtained by the method according to the invention, as far as elimination of impurities and manufacturing substrates form said single crystals are concerned.

The process for obtaining bulk gallium-containing nitride mono-crystal according to the present invention is carried out as defined in the independent claims 1, 23 and 47 while the preferred aspects of the process are defined in corresponding dependent claims (2-22, 24-32, 45-46 and 48-49).

The process of forming a substrate from bulk mono-crystalline gallium-containing nitride obtained by a method according to the invention is covered as stated in claim 33 and respective dependent claims (34-36).

The process for reducing the level of impurities in bulk mono-crystalline gallium-containing nitride obtained by a method according to the invention by annealing or removing the impurities by washing is indicated in the independent claims 37 and 41, respectively, while the preferred aspects of these processes are defined in corresponding dependent claims (38-40 and 42-44, respectively).

The process for obtaining of mono-crystalline gallium-containing nitride from the gallium-containing feedstock in a supercritical ammonia-containing solvent with mineralizer addition is characterized in that the feedstock is in the form of metallic gallium and the mineralizer is in the form of elements of Group I and/or their mixtures, and/or their compounds, especially those containing nitrogen and/or hydrogen, whereas the ammonia-containing solvent is in the form of the mineralizer and ammonia, there are two temperature zones in each step of the process, and the feedstock is placed in the dissolution zone, and at least one mono-crystalline seed is deposited in the crystallization zone, and following the transition of the solvent to the supercritical state, the process comprises the first step of transition of the feedstock from the metallic form to the polycrystalline gallium-containing nitride, and the second step of crystallization of the gallium-containing nitride through gradual dissolution of the feedstock and selective crystallization of gallium-containing nitride on at least one mono-crystalline seed at the temperature higher than that of the dissolution of the feedstock, while all the vital components of the reaction system (including the feedstock, seeds and mineralizer) invariably remain within the system throughout the whole process, and consequently bulk mono-crystalline gallium-containing nitride is obtained.

The process according to the invention may be carried out in the closed system.

Alternatively, in the process according to the invention the gaseous components in the reaction system can be exchanged after the first step of the process.

Preferably, in the process according to the invention, the gallium-containing nitride has the general formula of $Al_xGa_{1-x}N$, where $0 \leq x < 1$.

Preferably, hydrides, amides, imides, amido-imides, nitrides, azides or their mixtures are used as said compounds of Group I elements including nitrogen and/or hydrogen.

In the process according to the invention the ammonia-containing solvent produced may contain ions of Group I element, preferably sodium and
  (a) ions of another Group I element or
  (b) ions of Group II elements, preferably calcium or magnesium or
  (c) one or more substances containing oxygen-free species causing the weakening of the ammono-basic nature of the supercritical solvent or
  (d) ions of Group II elements, preferably calcium or magnesium and one or more substances containing oxygen-free species causing the weakening of the ammono-basic nature of the supercritical solvent.

Preferably, in the process according to the invention, the mineralizer is in the form of azides of Group I elements.

Preferably, said azides of Group I elements are $LiN_3$, $NaN_3$, $KN_3$, $CsN_3$ or their mixtures.

Preferably, the molar ratio of the introduced azides of Group I elements to ammonia ranges from 1:200 to 1:2.

In the process according to the invention the dissolution zone is above the crystallization zone.

According to the invention, convection and chemical transport between the two zones are suppressed in the first step, and the saturation degree of the supercritical solution with respect to soluble gallium compounds is reduced.

The reduction of the saturation degree of the supercritical solution with respect to soluble gallium compounds is obtained by adjusting the opening of the crucibles containing metallic gallium, placed in the dissolution zone.

According to the invention, the temperature ramping in the dissolution zone at the beginning of the first step is higher than 0.1° C./min, and then the temperature in the first step in the dissolution zone is maintained higher than 350° C., preferably higher than 400° C.

The temperature maintained in the first step in the crystallization zone causes that the seeds do not dissolve or dissolve in negligible degree.

In the process according to the invention the temperature in the dissolution zone is maintained higher than the temperature in the crystallization zone in the first step, and in the second step the temperature in the crystallization zone is raised to a higher value than the temperature in the dissolution zone.

Preferably, in the process according to the invention, the temperature in the first step in the crystallization zone is not higher than 500° C., preferably not higher than 400° C., most preferably not higher than 300° C.

Preferably, according to the invention, the temperature gradient between the zones at the beginning of the second step is reversed and mass transport by convection takes place between the zones.

In the process according to the invention, the temperature ramping in the crystallization zone at the beginning of the second step may enable a certain dissolution of the seed(s).

The temperature ramping in the crystallization zone at the beginning of the second step is higher than 0.5° C./min, and after supersaturation of the supercritical solvent with respect to soluble forms of gallium is obtained in the crystallization zone, the temperature in the crystallization zone is maintained at a fixed level.

In the process according to the invention, the second step may begin when the first step is not yet completed.

According to the invention in the second step the temperature in the dissolution zone is maintained lower than the temperature in the crystallization zone.

Preferably, the temperature in the second step in the crystallization zone is not lower than 350° C., preferably not lower than 400° C., most preferably ranges between 500° C. and 550° C.

The process according to the invention is characterized in that:
  the mineralizer is introduced into the autoclave and next the feedstock in the form of metallic gallium is placed in the dissolution zone of the autoclave, and at least one seed is mounted in the crystallization zone of the autoclave, and then the autoclave is filled with ammonia;

next, in the first step, transition of the solvent to the supercritical state takes place, while temperatures in both zones are maintained different by gradual and selective increase of the temperature in the dissolution zone in order to obtain at least partial reaction between metallic gallium and the supercritical solvent, and at the same time the temperature is maintained in the crystallization zone at which dissolution of seed(s) takes place in negligible degree;

next, the temperature is raised in the dissolution zone to the value at which the polycrystalline form of gallium-containing nitride is obtained, and the temperature is maintained in the crystallization zone at which seeds dissolve at negligible rate;

after polycrystalline gallium-containing nitride is obtained, at least partially, in the dissolution zone, the average temperature of the crystallization zone is increased to the value higher than the average temperature in the dissolution zone, chemical transport by convection is evoked and re-crystallization of gallium-containing nitride is carried out on the seed(s).

The process of controlling the growth rate of the bulk mono-crystalline gallium-containing nitride in the process according to the invention is characterized in that the process comprises the first step of transition of the feedstock from the metallic form to polycrystalline gallium-containing nitride, while convection and chemical transport are suppressed, and then the second step in which the conditions of dissolution of the feedstock and the saturation degree of the supercritical solution with respect to soluble gallium compounds are controlled, and after convection is evoked, the feedstock gradually dissolves and selective crystallization of gallium nitride on at least one mono-crystalline seed is carried out at the temperature higher than that for the dissolution of the feedstock, as long as the feedstock has completely or partially run out, and bulk mono-crystalline gallium-containing nitride is obtained.

Preferably, the dissolution rate of the feedstock in the second step is controlled depending on pressure and temperature of the process through selection of the mineralizer from the Group I elements, including lithium, sodium, potassium and their mixtures and compounds, especially those containing nitrogen and/or hydrogen.

A preferable molar ratio of the mineralizer to ammonia is used according to the set conditions of the process.

Preferably, in the process according to the invention, the dissolution rate of the feedstock in the second step is controlled through adjusting the opening degree of crucibles containing the polycrystalline gallium-containing nitride in the dissolution zone.

According to the invention, solubility of the feedstock increases in the second step through a decrease of the temperature in the dissolution zone.

Convection is controlled through temperature difference between the zones or through controlling the position of the zones with respect to each other.

Preferably, convection in the second step is controlled through controlling the opening of the baffle or baffles separating the two zones.

In the process according to the invention, concentration of soluble gallium-containing compounds in the supercritical solution in the crystallization zone in the second step increases until it attains minimal supersaturation degree with respect to gallium nitride through an increase of the temperature in the crystallization zone.

According to the invention, supersaturation of the supercritical solution with respect to gallium nitride increases in the crystallization zone through an increase of the temperature in that zone.

The process of forming a substrate from bulk mono-crystalline gallium-containing nitride obtained by a method according to the invention is characterized in that the thus obtained bulk mono-crystalline gallium-containing nitride layer is then sliced and polished.

According to the invention, the bulk mono-crystalline gallium-containing nitride layer crystallized on the seed has the thickness of over 1 mm, preferably over 3 mm.

In a process according to the invention, a protective layer is deposited on the obtained substrate by the crystallization method from the gaseous phase, preferably using the MOCVD or HVPE method.

Preferably, said protective layer has the form of $Al_xGa_{1-x}N$, where $0 \leq x < 1$.

The process for reducing the level of impurities in bulk mono-crystalline gallium-containing nitride obtained by a method according to the invention is characterized in that the thus obtained bulk mono-crystalline gallium-containing nitride is subjected to annealing in the atmosphere of inert gas, possibly with an addition of oxygen, at temperature between approx. 600 and 1050° C., thus producing material with higher crystalline quality than before the annealing.

In the process according to the invention, nitrogen and/or argon serve as inert gas.

According to the invention, annealing is carried out in the atmosphere of inert gas with an addition of oxygen between 10 and 30 vol. %.

The annealing process is carried out in a single step or in multiple steps until the desired level of impurities (such as hydrogen and/or ammonia or ions formed from the impurities formed during the crystallization and/or annealing process) is reached.

The process for removing impurities from bulk mono-crystalline gallium-containing nitride obtained by a method according to the invention is characterized in that the thus obtained mono-crystalline layer of bulk gallium-containing nitride has the thickness of over 1 mm, preferably over 3 mm, and then the layer is sliced into wafers which are (a) rinsed in the environment of supercritical ammonia-containing solvent, water or carbon dioxide or (b) rinsed in the environment of liquid ammonia-containing solvent, water or carbon dioxide or (c) subject to the action of gaseous hydrogen, nitrogen or ammonia with at least some impurities being washed off from the mono-crystalline nitride.

Preferably, the process for removing impurities by (a) rinsing in the environment of supercritical ammonia-containing solvent, water or carbon dioxide or (b) rinsing in the environment of liquid ammonia-containing solvent, water or carbon dioxide is aided by the application of ultrasounds.

Preferably, the process for removing impurities in the gaseous hydrogen, nitrogen or ammonia is aided by exposure to an electron beam.

Preferably, a wire saw is used for slicing bulk mono-crystalline gallium-containing nitride. Preferably, the slicing is preceded by relief annealing and the wafers obtained as a result of slicing are optionally also subjected to relief annealing.

According to the invention, the ammonia-containing solvent produced contains at least ions of Group I elements and ions of acceptors (Group II and Group IV) and the thus obtained bulk mono-crystalline gallium-containing nitride is annealed in the atmosphere that does not contain hydrogen but does contain oxygen.

Preferably, elements such as magnesium (Mg), zinc (Zn) or cadmium (Cd) serve as acceptors.

The process of obtaining bulk mono-crystalline gallium-containing nitride from the gallium-containing feedstock in a supercritical ammonia-containing solvent is characterized in that the feedstock is in the form of metallic gallium or mono-crystalline gallium-containing nitride, and the ammonia-containing solvent is in the form of ammonia with addition of mineralizer in the form of the Group I elements and/or their mixtures, and/or their compounds, especially those containing nitrogen and/or hydrogen, there are two temperature zones in each step of the process, and the feedstock is placed in the dissolution zone and at least one mono-crystalline seed is deposited in the crystallization zone, and following the transition of the solvent to the supercritical state, the process comprises the first step of transition of metallic gallium to the solution at the first temperature, and then the second step of selective crystallization of gallium nitride on the feedstock in the form of mono-crystalline gallium-containing nitride, and then the third step of crystallization of the gallium nitride, through gradual dissolution of the feedstock and selective crystallization of gallium-containing nitride on at least one seed at the temperature higher than that of the dissolution of the feedstock, while all the vital components of the reaction system (including the feedstock, seeds and mineralizer) invariably remain within the system throughout the whole process, and subsequently bulk mono-crystalline gallium-containing nitride is obtained.

The aforementioned process may be carried out in the closed system.

Alternatively, in the aforementioned process according to the invention the gaseous components in the reaction system can be exchanged after the first step of the process.

The above characterized process of obtaining bulk mono-crystalline gallium-containing nitride assures a possibility to obtain, in a single process, mono-crystalline gallium-containing nitride of a volume sufficient to obtain more substrates for epitaxy of exceptionally low dislocation density and uniform properties for the entire volume, which enables standardization of them. As a result of the slicing process according to this invention, multiple substrates for epitaxy can be obtained from the thick layer of bulk mono-crystalline gallium-containing nitride, all with analogical properties and unified parameters. Moreover, according to this invention, by depositing the protective layer on the sliced and polished substrates for epitaxy, preferably by the crystallization method from a gaseous phase, the threat is prevented of the possible penetration of impurities from the substrate to the epitaxial layers which are later deposited on the substrate. After slicing the mono-crystalline layer into wafers with a wire saw, the wafers are again introduced into the environment of a supercritical ammonia solvent, water, or carbon dioxide in order to remove the impurities in such a way as to ensure that they can serve as substrates for epitaxy.

At the same time, in the process according to the invention, limitations related to purity and availability of feedstock were diminished significantly. According to the invention, bulk mono-crystalline gallium-containing nitride may be obtained using metallic gallium as initial material, while metallic gallium of high purity is relatively cheap and easily available, comparing to e.g. HVPE GaN.

Due to application of a modified mineralizer in the process according to the invention, high growth rates of gallium-containing nitride crystals were obtained, and additionally, due to the selection of Group I element, further improvement of process parameters was obtained. Moreover, the use of Group I elements with acceptors, followed by the annealing process, activates the acceptors in bulk gallium-containing mono-crystals and thus enables obtaining bulk mono-crystalline gallium-containing nitride with modified electrical properties, preferably p-type doped.

The best substrate obtained by the method according to the invention has the surface dislocation density close to $10^4/cm^2$ with simultaneous half-width of X-ray rocking curve from (0002) plane below 60 arcsec (for Cu $K\alpha_1$).

The conducted experiments show that the best bulk mono-crystalline gallium-containing nitride obtained by the method according to the invention has the dislocation density close to $10^4/cm^2$ with simultaneous half-width of X-ray rocking curve from (0002) (Cu $K\alpha_1$) plane below 60 arcsec, guaranteeing an appropriate quality and durability of optical semiconductor devices produced with its use.

The object of this invention is illustrated in the attached figures where.

FIG. 1 presents the cross-section of the autoclave and a set of furnaces used in this invention.

FIG. 2 presents the perspective view of the apparatus for obtaining bulk mono-crystalline gallium-containing nitride according to the invention.

FIG. 3 presents the dependence of solubility of GaN in the supercritical ammonia containing potassium amide (with $KNH_2:NH_3=0.07$) on pressure at temperature T=400° C. and T=500° C.

FIG. 12 shows the change of temperature in time inside the autoclave in Example XIII and.

Figure 1:
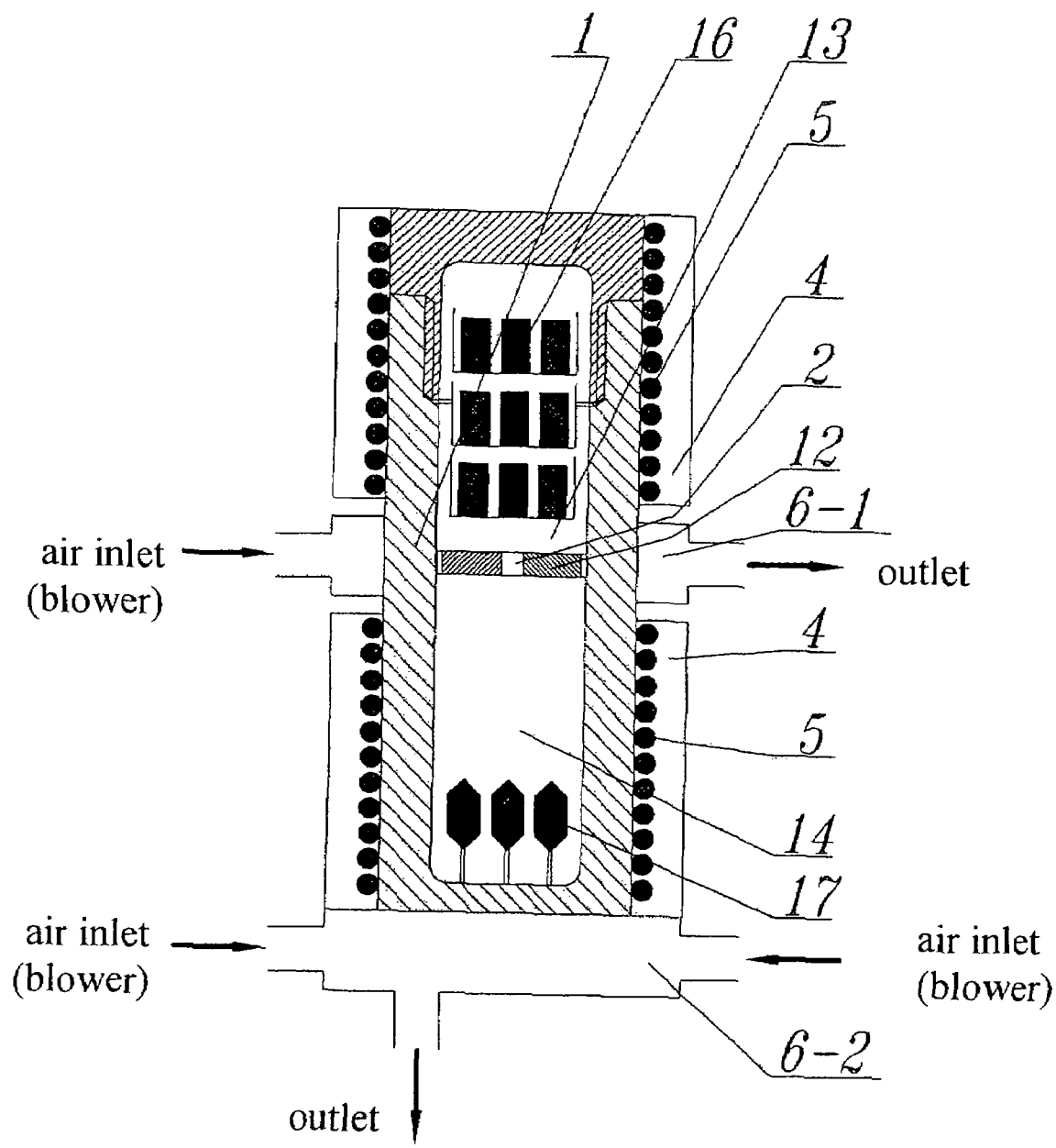

In this invention, the growth of the mono-crystalline gallium-containing nitride is obtained by chemical transport in the supercritical solvent containing one or more mineralizers of ammono-basic nature. Thus, this is a technique of crystallization from a solution of ammono-basic nature. Any terms used herein should be understood according to the definitions below.

Group XIII element(s) nitride means a nitride of Group XIII element(s), i.e. aluminum, gallium and indium either alone or in any combination. Gallium-containing nitride is the most preferred such nitride.

Gallium-containing nitride means a nitride of gallium and optionally other element(s) of Group XIII. It includes, but is not restricted to, the binary compound—GaN, a ternary compound —AlGaN, InGaN or a quaternary compound AlIn- GaN, preferably containing a substantial portion of gallium, anyhow at the level higher than dopant content. The composition of other elements with respect to gallium may be modified in its structure insofar as it does not collide with the ammono-basic nature of the crystallization technique. (The mentioned formulas are only intended to give the components of the nitrides. They are not intended to indicate their relative amounts.)

Bulk mono-crystal of gallium-containing nitride means a mono-crystal—especially for use as a substrate for epitaxy—made of gallium-containing nitride, to be used in the process for manufacturing various opto-electronic devices such as LED or LD, which can be formed by epitaxial methods, such as MOCVD and HVPE, wherein the thickness of the mono-crystal is preferably at least 1 mm, more preferably at least 3 mm.

C-, A- or M-plane refers to C-, A- or M-plane surfaces of hexagonal Group XIII element nitride crystals.

Precursor of gallium-containing nitride is a substance or a mixture containing at least gallium, which may also contain Group I elements, elements of Group XIII, nitrogen and/or hydrogen, and metallic gallium, its alloys or metallic compounds, hydrides, amides, imides, amido-imides and azides, which may form gallium compounds soluble in the supercritical ammonia-containing solvent as defined below.

Gallium-containing feedstock is gallium-containing nitride or its precursor. Feedstock can be in the form of: GaN obtained by any method, e.g. flux methods, HNP method, HVPE method, or polycrystalline GaN obtained in situ from metallic gallium as the result of a chemical reaction in the supercritical ammonia-containing solvent.

Supercritical ammonia-containing solvent is a supercritical solvent consisting at least of ammonia, which contains one or more types of ions of Group I elements, used for dissolution of gallium-containing feedstock. The supercritical ammonia-containing solvent may also contain derivatives of ammonia and/or their mixtures, in particular—hydrazine.

Mineralizer is a substance delivering one or more types of ions of Group I elements to the supercritical ammonia-containing solvent, supporting dissolution of gallium-containing nitride.

Substances containing oxygen-free species causing the weakening of ammono-basic nature of the supercritical solution are selected from the group which includes:
a) compounds $A_mB_n$, where A means $H^+$ and/or metal, preferably Group I element, $NH_4^+$, Si, S, P, whereas B means halogens, S, P, and n and m mean corresponding stoichiometric coefficients not lower than 1 and/or
b) groups of species such as:
$S_4N_4$, $S_2N_2$, SN, $S_4N_2$, $S_{11}N_2$, $P_3N_5$, $P_4N_6$, PN, $PN_2^-$, $PN_3^{4-}$, $PN_4^{7-}$, $PN^-$, $PN^{2-}$,
$PNCl_2$, $P(NH)_2NH_2$, $P_4S_{10}$, $NP(SNH_4)_2$, $NPSNH_4SH$, $NP(SH)_2$, PNS, Sulfur or silicon species built in the crystalline lattice of the gallium-containing nitride serve as donors; magnesium, zinc or cadmium are acceptors; dopants such as manganese or chromium in the crystalline gallium nitride lattice provide it with magnetic properties; whereas phosphor atoms are isoelectronic with respect to nitrogen atoms, and thus they make the energy gap narrower than that in the pure gallium-containing nitride. Those species do not only cause the weakening of ammono-basic nature of the supercritical solvent, but they also modify optical, electrical and magnetic properties of the gallium-containing nitride.

Dissolution of the gallium-containing feedstock is a reversible or irreversible process of formation, through the feedstock, of gallium compounds soluble in the supercritical solvent, for example gallium complexes. Gallium complexes are chemical complex compounds, in which centrally placed gallium atom is surrounded by $NH_3$-type ligands or their derivatives, such as $NH_2^-$, $NH^{2-}$.

Supercritical ammonia-containing solution means a solution obtained as a result of dissolution of the gallium-containing feedstock in the supercritical ammonia-containing solvent.

Solubility: Our experiences show that equilibrium may be achieved between the solid, which is gallium-containing nitride, and the supercritical solution at sufficiently high temperature and pressure. Therefore, solubility of gallium-containing nitride may be defined as the equilibrium concentration of soluble gallium compounds obtained in the above mentioned process of dissolution of gallium-containing nitride. In this process, the equilibrium concentration, i.e. solubility, may be controlled by modifying the composition of the solvent, temperature and/or pressure.

Negative temperature coefficient of solubility (negative TCS) means that solubility is decreasing with temperature while all the other parameters are constant. Whereas a positive pressure coefficient of solubility (positive PCS) means that solubility is increasing with pressure while all the other parameters are constant. Our research allow to state that solubility of gallium-containing nitride in the supercritical ammonia-containing solvent, at least in the temperature range from 300 to 550° C., and pressure from 100 to 550 MPa, shows a negative temperature coefficient and a positive pressure coefficient. This means, for example, that after the feedstock is dissolved in the autoclave and maintained for several days at the temperature of 400° C. (namely after the dissolution process), it is possible to obtain re-crystallization of gallium nitride, if temperature inside the autoclave is increased to 500° C. and pressure is kept constant at the level of 200 MPa (crystallization process). Alternatively, after the feedstock is dissolved in the autoclave under increased pressure maintained for a couple of days at the level of 350 MPa (namely after the dissolution process), it is possible to obtain re-crystallization of gallium nitride by lowering pressure to 200 MPa and maintaining constant temperature of 500° C. (crystallization process).

Supersaturation: If concentration of soluble gallium compounds in the supercritical ammonia-containing solution is higher than solubility of gallium-containing nitride in specific physico-chemical conditions, then the supersaturation of the supercritical ammonia-containing solution with respect to gallium-containing nitride in those conditions can be defined as the difference between the actual concentration and the solubility. While dissolving gallium-containing nitride in a closed system it is possible to obtain the supersaturation state, for example, by increasing temperature or decreasing pressure.

Chemical transport of gallium-containing nitride in the supercritical ammonia-containing solution is a continuous process involving dissolution in the supercritical solution of the gallium-containing feedstock, transport of soluble gallium compounds through the supercritical solution, as well as crystallization of the gallium-containing nitride from the supersaturated supercritical solution. Generally, the chemical transport can be caused by the difference in temperature, difference in pressure, difference in concentration, or other chemical or physical differences between the feedstock being dissolved and the crystallization product. Due to the process according to the invention, it is possible to obtain bulk mono-crystalline gallium-containing nitride as a result of the chemical transport in the conditions of temperature difference, yet it is necessary to maintain higher temperature in the crystallization zone than in the dissolution zone. According to the invention, the chemical transport is preferably caused by convection.

Seed as it has already been mentioned, is crucial for obtaining desired bulk gallium-containing nitride mono-crystals in a process according to the present invention. In view of the fact that the quality of the seed is crucial for the crystalline quality of the bulk gallium-containing nitride mono-crystals obtained by the process according to the present invention, the seed selected for the process should have possibly high quality. Various structures or wafers having a modified surface can also be used. For example a structure having a number of surfaces spaced adequately far from each other, arranged on a primary substrate and susceptible to the lateral overgrowth of crystalline nitrides may be used as a seed. Moreover, a seed having a homoepitaxial surface, exhibiting n-type electrical conductivity, for example doped with Si, may be used. Such seeds can be produced using processes for gallium-containing nitride crystal growth from gaseous phase, such as HVPE or MOCVD, or else MBE. Doping with Si during the growth process at the level of $10^{16}$ to $10^{21}/cm^2$ ensures n-type electric conductivity. Moreover, a composite seed may be used and in such seed directly on a primary substrate or on a buffer layer made for example of AlN— a layer made of GaN doped with Si may be deposited. Furthermore, for a particular future use, bulk mono-crystals can be grown by the process according to the present invention on homo-seeds having a defined orientation with respect to hexagonal wurzite type crystallographic lattice of the specific Group XIII element(s) nitride, such as C-plane, A-plane or M-plane of the respective nitride.

Spontaneous crystallization from the supersaturated supercritical ammonia-containing solution means any undesirable process of nucleation and growth of the gallium-containing nitride crystals taking place at any site within the autoclave except on the surface of the seed. The definition also includes growth on the surface of the seed, in which the grown crystal has the orientation different from that of the seed.

Selective crystallization on the seed means the process of crystallization taking place on the surface of the seed in the absence of spontaneous crystallization, but also when spontaneous crystallization occurs in negligible degree. This process is indispensable to obtain bulk mono-crystal and, at the same time, it is one of the elements of this invention.

Temperature and pressure of the reaction: In the examples presented in the specification, temperature profile inside the autoclave was measured with use of an empty autoclave, thus without supercritical ammonia-containing solution. Therefore, these are not real temperatures of the process carried out in supercritical conditions. Pressure was measured directly or calculated on the basis of physico-chemical data of ammonia-containing solvent for the assumed temperature of the process and autoclave volume.

MOCVD Method (Metallo-Organic Chemical Vapor Deposition) means the process of deposition of epitaxial layers from a gaseous phase, in which ammonia and metallo-organic gallium compounds are used as substrates in the case of gallium nitride.

HVPE Method (Halide Vapor Phase Epitaxy) means the process of deposition of epitaxial layers from a gaseous phase, in which metallic halides and ammonia are used as reagents in the case of nitrides.

Autoclave means a closed pressurized reactor, which has a reaction chamber where the ammonobasic process according to the present invention is carried out.

Figure 2:
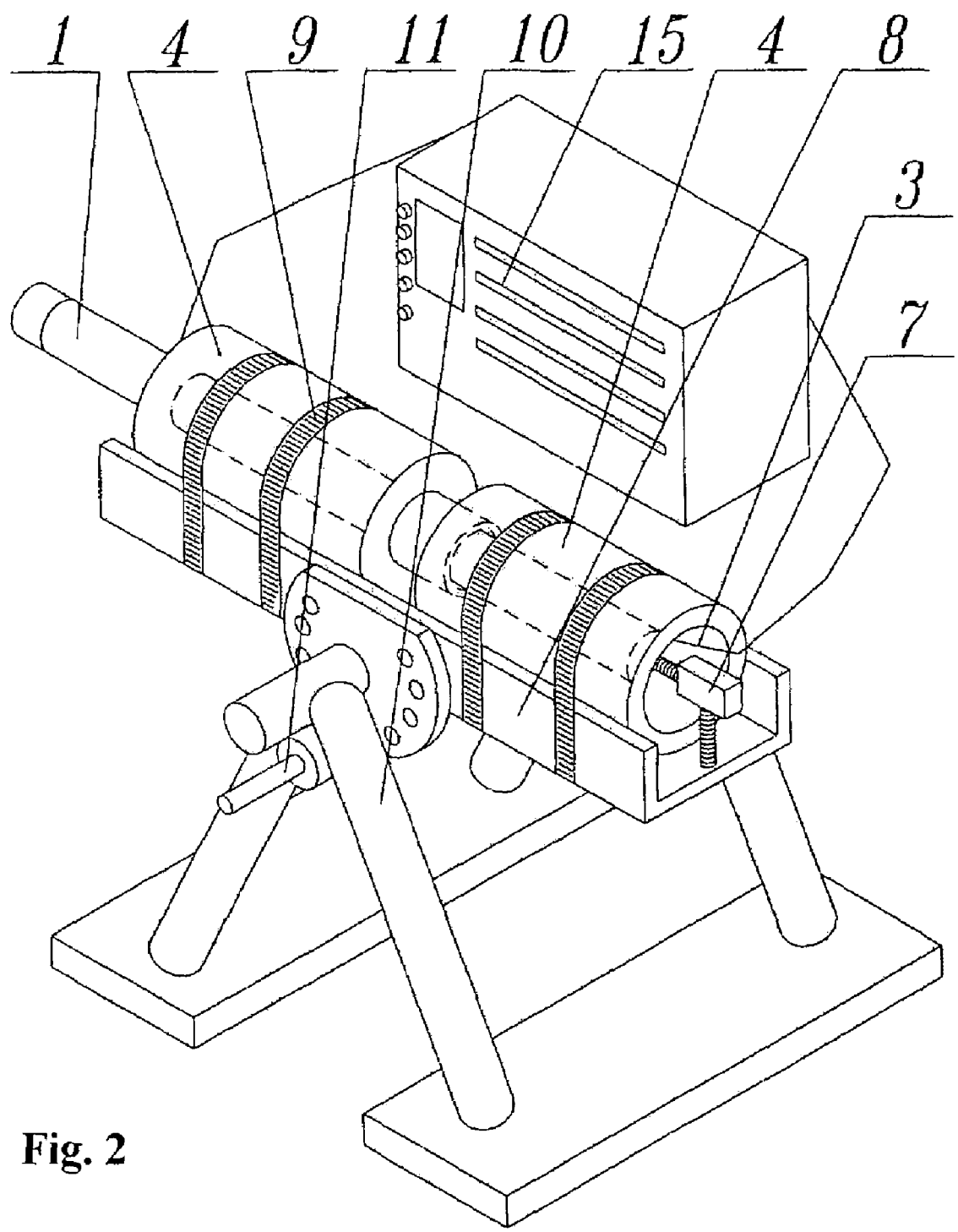

The apparatus used to carry out the process according to the invention is schematically presented in FIG. 1 and FIG. 2, although it has to be noticed that the inventive process can be realized in pressurized reaction vessels of different constructions as long as the principles outlined in the specification and the claims are adhered to.

The main part of the apparatus is the autoclave 1 used for bringing the solvent into a supercritical state. The autoclave is equipped with the installation 2, which enhance chemical transport in the supercritical solution within the autoclave 1. The autoclave 1 is situated in the chamber 3 of the furnace 4, equipped with heating units 5 and cooling means 6. Position of the autoclave 1 within the chamber 3 is secured by a screw blocking device 7. The furnace 4 is embedded in the bed 8 and secured with steel tapes 9 tightly wound around the furnace 4 and the bed 8. The bed 8 with the furnace 4 is pivotally mounted on the supporting base 10 and secured in the desired position by means of a pin securing device 11. By tilting the autoclave during the crystallization process it is possible to influence the convective flow and thus the chemical transport. The convective flow in the autoclave 1 placed in the furnace 4 is established by means of the installation 2 in the form of a horizontal baffle 12 of a size corresponding to not less than 70% of horizontal cross section area of the autoclave 1. The baffle 12 separates the dissolution zone 13 from the crystallization zone 14. The horizontal baffle 12 is located approximately in the middle of the autoclave 1 in terms of longitudinal dimension. Temperature values in individual zones of the autoclave 1, falling within the range from 100° C. to 800° C., are controlled by setting up respective temperature for the furnace 4 by a control unit 15. In the autoclave 1 the dissolution zone 13 corresponding to low temperature zone of the furnace 4 is situated above the horizontal baffle(s) 12. The feedstock 16 is placed in the dissolution zone 13 and the amount of the feedstock 16 is such that its volume does not exceed 50% of volume of the dissolution zone 13. Simultaneously, when metallic gallium is introduced as the feedstock 16 in crucibles, the total volume of the crucible should not exceed 80% of volume of the dissolution zone 13 and the amount of metallic gallium feedstock 16 should match the former requirement (50% of the dissolution zone volume). The crystallization zone 14 corresponds to high temperature zone of the furnace 4 and is situated below the separating baffle(s) 12. In the crystallization zone 14 the seed 17 is located and the specific position in which the seed 17 is placed is below crossing of up-stream convective flow and down-stream convective flow, but still above the bottom of the crystallization zone 14. The separating baffle(s) 12 is/are positioned within the zone of cooling means 6. As the result of cooling the baffle 12 region, the temperature difference between the dissolution zone 13 and the crystallization zone 14 may be controlled. At the level of the bottom of the crystallization zone 14 there is another cooling device 18, used in order to cool down the zone after the process is over, so that the dissolution of the grown crystal(s) during the cooling stage after the process is remarkably reduced.

Figure 3:
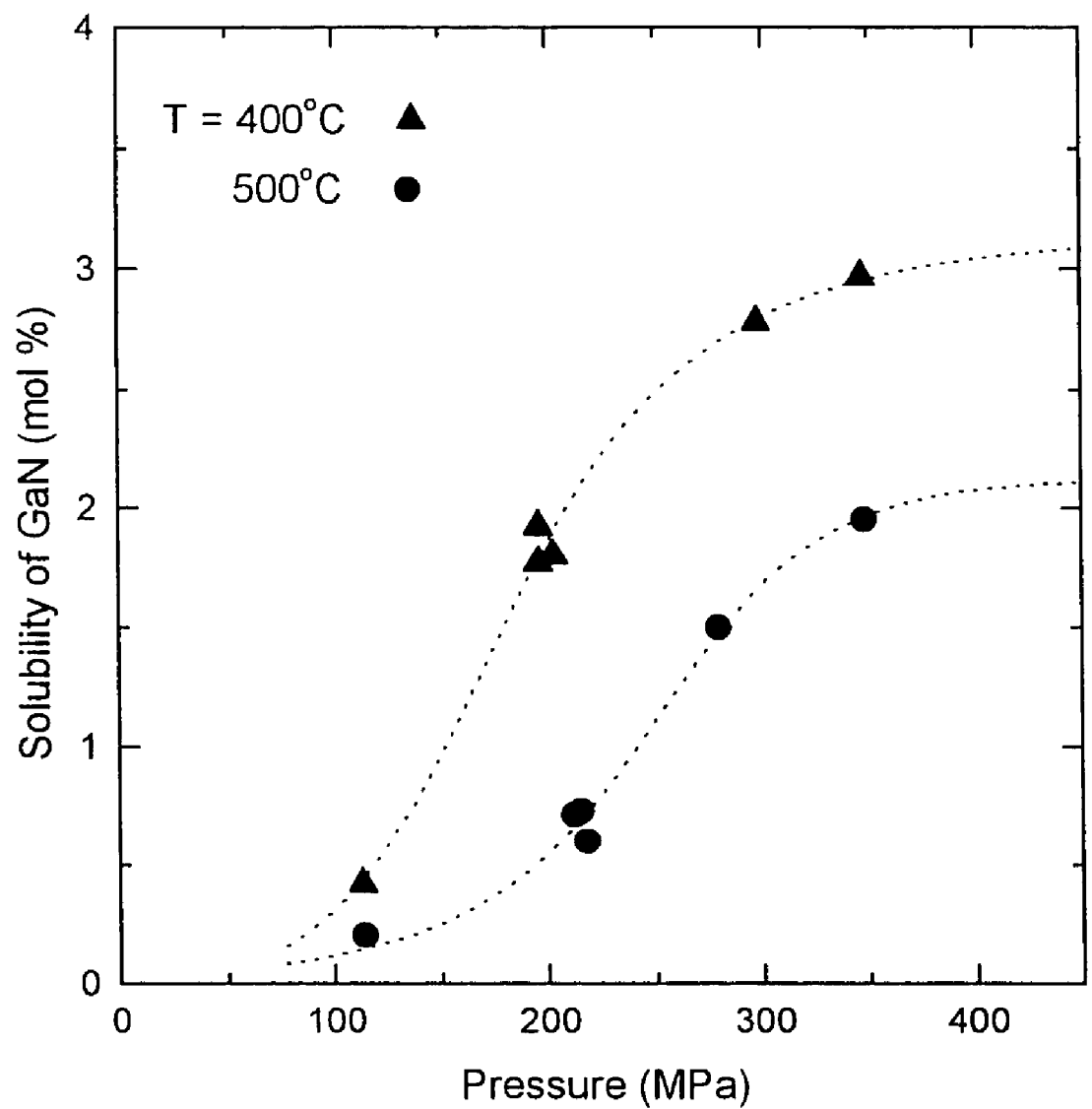

Gallium nitride exhibits good solubility in supercritical ammonia, provided that the latter contains Group I and optionally Group II elements or their compounds, such as e.g. $KNH_2$. FIG. 3 presents how the solubility of GaN in supercritical ammonia-containing solvent depends on pressure, for temperature 400° C. and 500° C. Here the solubility is defined as the molar percentage: $S_m \equiv [GaN^{solution}:(KNH_2+NH_3)] \times 100\%$. In this example $KNH_2$ is used in the molar ratio of $KNH_2:NH_3=0.07$. In this case $S_m$ is a smooth function of only three parameters: temperature (T), pressure (p), and molar ratio of the mineralizer (x), i.e. $S_m = S_m(T, p, x)$. Small changes of $S_m$ can be expressed as:

$$\Delta S_m \approx (\partial S_m/\partial T)|_{p,x}\Delta T + (\partial S_m/\partial p)|_{T,x}\Delta p + (\partial S_m/\partial x)|_{T,p}\Delta x,$$

where the partial derivatives (e.g. $(\partial S_m/\partial T)|_{p,x}$) determine the behavior of $S_m$ with variation of its parameters (e.g. T). In this specification these partial derivatives are called "coefficients" (e.g. $(\partial S_m/\partial T)|_{p,x}$ is a "temperature coefficient of solubility—TCS").

As it results form the diagram presented in FIG. 3, the solubility is a decreasing function of temperature and an increasing function of pressure. On the basis of these dependences it is possible to obtain bulk mono-crystalline gallium-containing nitride by dissolving it under higher solubility conditions and crystallizing under lower solubility conditions. Negative temperature coefficient of solubility means that in the presence of a temperature gradient the chemical transport of gallium-containing nitride occurs from lower temperature dissolution zone to higher temperature crystallization zone.

Therefore, the process for obtaining bulk mono-crystalline gallium-containing nitride according to the invention consists in the following:

The feedstock is put in the upper zone 13 of the reactor (autoclave), while at lest one mono-crystalline seed 17 (of a gallium-containing nitride) is placed in the lower zone 14 of the reactor. According to the invention, the feedstock contains metallic gallium. The autoclave is also charged with the mineralizer, filled with ammonia and tightly closed.

In the first step of the process the average temperature inside the autoclave is increased and two temperature zones are created inside the autoclave. At increased temperature, ammonia undergoes a transition to the supercritical state and reacts with the mineralizer, forming supercritical ammonia-containing solvent. This solvent enables the reaction between metallic gallium and the supercritical ammonia-containing solution in the upper zone of the reactor. Because temperature in the upper zone of the reactor is maintained higher than that in the lower zone, convection is suppressed. Under such conditions, the reaction of the feedstock in the form of metallic gallium to crystalline gallium nitride goes to completion. This reaction is local, as it takes place only in the upper (higher temperature) zone of the autoclave. Crystalline gallium nitride has more favorable solubility characteristics in the environment of the supercritical ammonia-containing solvent than metallic gallium. At the same time, dissolution of crystallization seeds placed in the lower temperature zone is highly reduced.

The second step of the process according to the invention begins after an inversion of the temperature gradient as a result of raising the temperature in the lower zone to the value higher than the temperature in the upper zone of the reactor at the final phase of the first step, with a possible small decrease of the temperature in the upper zone. This evokes convective chemical transport between the zones in the second step of the process. During the first step of the process the seeds do not dissolve or they dissolve in negligible degree. However, during the inversion of the temperature gradient within the autoclave, the seeds may dissolve to some extent. Such partial dissolution of the seeds may even bring positive results since it purifies the surface additionally.

Due to the negative TCS of GaN in supercritical ammonia-containing solvent, the feedstock in the form of polycrystalline gallium nitride, obtained in the first step of the process, is gradually dissolving in the upper zone of the reactor and gallium-containing nitride is selectively crystallizing on the mono-crystalline seed(s) 17. Thus, in the second step of the process according to the invention, which is actually the re-crystallization step, the upper zone of the reactor (having lower temperature) becomes the dissolution zone 13, while the lower zone (having higher temperature) becomes the crystallization zone 14.

Alternatively, the process for obtaining bulk mono-crystalline gallium-containing nitride according to the invention may consist of three steps. In this case, the feedstock in the form of metallic gallium and gallium nitride crystals is introduced into the autoclave. First, metallic gallium is transferred to a solution, and then, in the second step, under the controlled temperature conditions, crystalline gallium nitride is deposited from the supercritical ammonia-containing solution in the dissolution zone, preferably on the feedstock introduced in the form of gallium nitride crystals. Finally, in the third step, under the controlled conditions, the feedstock (partially processed) is gradually dissolving and then it is selectively crystallizing on the mono-crystalline gallium-containing nitride seed(s) in the crystallization zone.

The use of feedstock in the form of polycrystalline gallium nitride in the GaN re-crystallization process (the second step of the process) is preferable, because it can successfully replace a relatively expensive and not easily available feedstock in the form of mono-crystalline wafers (e.g. from HVPE method). A disadvantage of polycrystalline materials is that it is difficult to purify them from adsorbed impurities. The process according to the invention eliminates this inconvenience, because obtaining polycrystalline GaN from metallic gallium (the first step) and re-crystallization (the second step) take place as part of one continuous process, hence with maximal elimination of impurities. The use of metallic gallium as initial material is very convenient, as metallic gallium of high purity is relatively cheap and easily available, comparing to HVPE GaN.

In the case of the three-step process for obtaining bulk mono-crystalline gallium-containing nitride according to the invention, the application of two forms of the feedstock at the same time—in the form of metallic gallium and mono-crystalline gallium-containing nitride—has a principal advantage since it allows a considerable reduction of the loss of mono-crystalline gallium-containing nitride dissolved in the third step of the process.

Seeds for the process according to the invention may be obtained by any method. Preferably, GaN crystals are used, which are obtained by HVPE method. This enables to obtain GaN mono-crystals in the form of wafers of a relatively large surface area. The application of such seeds allows to obtain, in the process according to the invention, bulk mono-crystalline gallium-containing nitrides of very low dislocation density and being very thick at the same time. The crystals obtained in the process according to the invention are perfect material for substrates for epitaxial deposition of semiconductor layers. At the same time, they may be used for preparing seeds for further processes carried out according to the invention.

Mineralizer can be in the form of Group I elements, their compounds, especially those containing nitrogen and/or hydrogen and mixtures thereof. Group I elements may be selected from the group consisting of Li, Na, K, Rb and Cs, whereas their compounds may be selected from hydrides, amides, imides, amido-imides, nitrides and azides. One or more Group I elements may be used at the same time in one process. According to the invention, the mineralizer may also contain substances containing oxygen-free species causing the weakening of the ammono-basic nature of the supercritical solution. In particular, they are introduced in the form of compounds carrying sulfur species: sulfide of Group I element $M_2S$, $H_2S$, $(NH_4)_2S_x$. A preferable example of such a substance is also $PH_3$. The molar ratio of the substances containing oxygen-free species causing the weakening of the ammono-basic nature of the solvent to the Group I element, which is jointly introduced, is 1:100 and 1:10. Ions of acceptors, preferably magnesium, zinc and cadmium, may be optionally introduced into the supercritical ammonia-containing solution. Those ions are introduced in the form of corresponding metals, amides or azides of those metals. The molar ratio of ions of acceptors to ions of Group I element is between 1:100 and 1:5, preferably between 1:30 and 1:10.

Joint application of the mineralizer in the form of one or more Group I elements, optionally acceptors and optionally the mineralizer from a group of substances containing oxygen-free species causing the weakening of ammono-basic nature of a supercritical solvent, improves dissolution of gallium-containing nitride, and the growth rate of the bulk mono-crystalline gallium-containing nitride. Moreover, simultaneous application of Group I elements with acceptors, together with the appropriate post-treatment of obtained crystal, activates the acceptors in the obtained bulk gallium-containing mono-crystal.

It has been proven that in the process according to the present invention the use of Group I and optionally Group II element azides is beneficial in various aspects, when the molar ratio of Group I element azides to ammonia ranges from 1:200 to 1:2. The Group I and Group II element azides of very high purity in a solid form are available commercially. Moreover, they can be easily purified. Once purified, the azides retain high purity for a relatively long time, as they are non-reactive and almost non-hygroscopic, thus they do not absorb impurities from air. The azides may be stored, manipulated and (in particular) put into an autoclave without such special precautionary measures or equipment (e.g. a glove box), which are indispensable when handling e.g. metallic lithium, sodium or potassium.

Group I and Group II element azides dissolve in a supercritical ammonia-containing solution. The research studies directed to the use of azide mineralizers in processes according to the present invention revealed that under the present process conditions the azide ammonia solution is chemically stable up to a certain temperature, at which the azide starts to decompose (in the case of $NaN_3$ this is ca. 250° C.). Below this temperature the azide ammonia solution is hardly reactive with respect to feedstock and the azide does not act as the ammonobasic mineralizer. However, when the temperature of the supercritical ammonia-containing solution goes high enough (in the case of $NaN_3$—beyond 300° C.), intensive decomposition of azide ion $N_3^-$ takes place and molecular nitrogen $N_2$ is released. Only at this stage the azide commences to act as mineralizer, and enhances dissolution of the feedstock and crystallization of gallium-containing nitride on the seed. Thus, during the process according to the present invention realized with metallic gallium as the feedstock, the use of azides makes it easier to control supersaturation and the amount of gallium that does not dissolve.

The main disadvantage of using azides is the extra pressure, originating from the gaseous nitrogen, released during decomposition of azide. The increment of pressure is remarkable and usually undesired, because more durable autoclaves are then needed. However, one can get rid of this effect. There are several ways to do it. The one presented below—as an example—should not be construed as limiting. The azide can be first closed in an empty autoclave (or an autoclave filled with an inert gas), together with the other starting materials (feedstock, seeds etc.) and decomposed by heating to the temperature higher than the decomposition temperature of the azide(s) used. The autoclave contains then a mixture, comprising the (undesired) gaseous nitrogen. Then the temperature should be decreased back below the critical temperature of the mixture, the autoclave should be at least partially evacuated and charged with the solvent (ammonia). Alternatively, all the starting materials (including the mineralizer in the form of azide) and ammonia are placed in the autoclave at the beginning of the process. The autoclave is then heated, so as to transform the ammonia into the supercritical state. In properly controlled temperature distribution the mineralizer reacts with supercritical ammonia, forming supercritical ammonia-containing solvent with ions of Group I elements and molecular nitrogen $N_2$ is released. Metallic gallium, contained in the feedstock, reacts with the supercritical solvent, producing polycrystalline gallium-containing nitride. Then the autoclave should be cooled back below the critical point of the ammonia-containing solution, completely evacuated (with all the vital components of the reaction system, including the feedstock in the form of polycrystalline GaN, seeds and mineralizer in the form of amide(s) of Group I element(s), invariably remaining within the autoclave). The autoclave should be then charged again with the solvent (ammonia) and the two-step or three-step variant of the process for obtaining bulk mono-crystalline gallium-containing nitride according to the invention can be carried on, as described above. Note, that the Group I and optionally Group II element amide(s) remaining in the autoclave after decomposition of their azides may have a very high level of purity, hardly available otherwise.

The gallium-containing nitride obtained by a method according to this invention has the general formula of $Al_xGa_{1-x-y}In_yN$, where $0 \leq x < 1$, $0 \leq y < 1$, $0 \leq x+y < 1$, preferably $Al_xGa_{1-x}N$, where $0 \leq x < 1$, and depending on the application it may contain donor-type, acceptor-type, or magnetic-type dopes.

The environment of a supercritical ammonia-containing solvent containing ions of Group I elements, as used in the process according to the invention, may also contain ions of other metals and soluble forms of other elements, introduced intentionally to modify the properties of the obtained monocrystalline gallium-containing nitride. However, this environment contains also accidental impurities introduced together with initial materials, and released to that environment during the process from elements of the applied apparata. Reduction of accidental impurities is possible, in the process according to the invention, through application of reagents of very high purity, or even purified additionally for the needs of the process according to the invention. Impurities from the apparata are also subject to control by way of selection of construction materials in accordance with the principles known to the experts of that art. Moreover, the bulk mono-crystalline gallium-containing nitride can receive donor-type dopants (e.g., Si, O) and/or acceptor-type dopants (e.g., Mg, Zn) and/or magnetic-type dopants (e.g., Mn, Cr) in the concentrations of between $10^{17}$ and $10^{21}/cm^3$, provided that they are present in the environment of the process. Those dopants modify the optical, electrical and magnetic properties of gallium-containing nitride.

Figure 4:
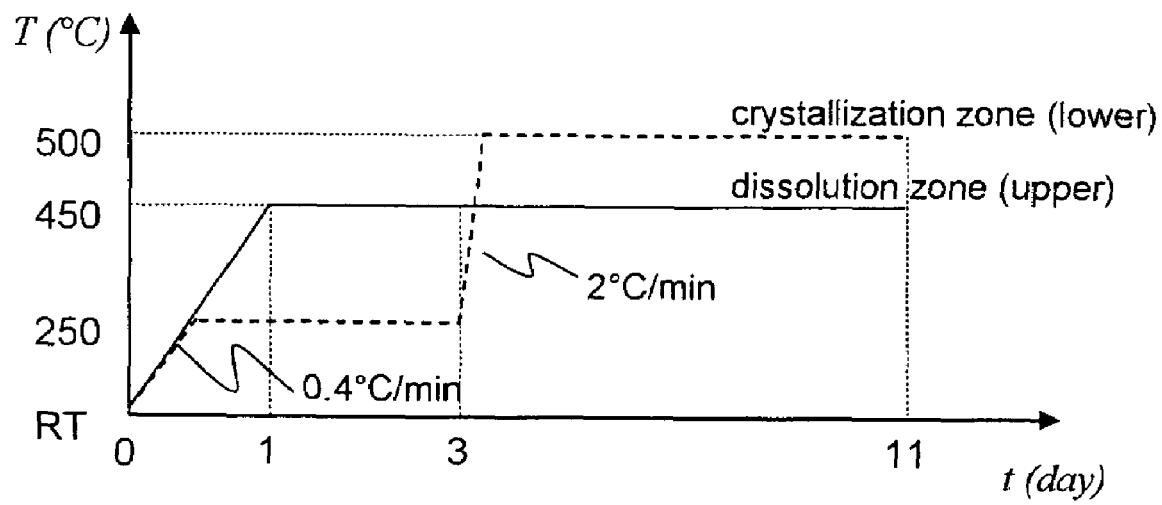
FIG. 4 shows the temporal change of temperature in a preferable embodiment of the process according to the invention (Example I).

In the preferable embodiment of the process according to the invention (Example I), illustrated in FIG. 4, after the transition of the ammonia-containing solution to the supercritical state, the temperature in the first step, in the upper zone—the dissolution zone of the autoclave 13—is raised to the level of 450° C. and maintained for the set period of time (FIG. 4). At the same time, temperature in the lower zone of the autoclave—the crystallization zone 14—is maintained at the level of about 250° C. Under those conditions metallic gallium is transformed into polycrystalline gallium nitride in the dissolution zone, while dissolution of the seeds in the dissolution zone takes place at negligible rate.

In this example, the first step of the process is carried out until reaction of metallic gallium goes to completion and crystalline GaN is obtained, or longer. Under those conditions, GaN obtained in the dissolution zone has a polycrystalline form and a developed surface.

Next, after about 3 days, the second step of the process begins and the crystallization zone is heated to the temperature exceeding the temperature of the dissolution zone, which is maintained principally on the same level as at the end of the first step. After a temperature difference is attained between the zones and the temperature gradient is reversed with respect to that maintained in the first step of the process—dissolution of the feedstock takes place in the dissolution zone, and chemical transport between the zones takes place through convection, and when supersaturation of a supercritical ammonia-containing solution with respect to GaN is attained, crystallization of GaN takes place selectively on the seeds in the crystallization zone.

According to the invention, temperature difference between the zones in the second step may change in a wide range, preferably between several and one hundred and several dozen degrees centigrade. Additionally, in accordance with the invention, the temperature difference between the zones may be modified in course of the process. In this way, it is possible to control the growth rates and quality of the obtained bulk mono-crystalline gallium-containing nitride.

The process according to the invention may be carried out with some modifications.

Figure 5:
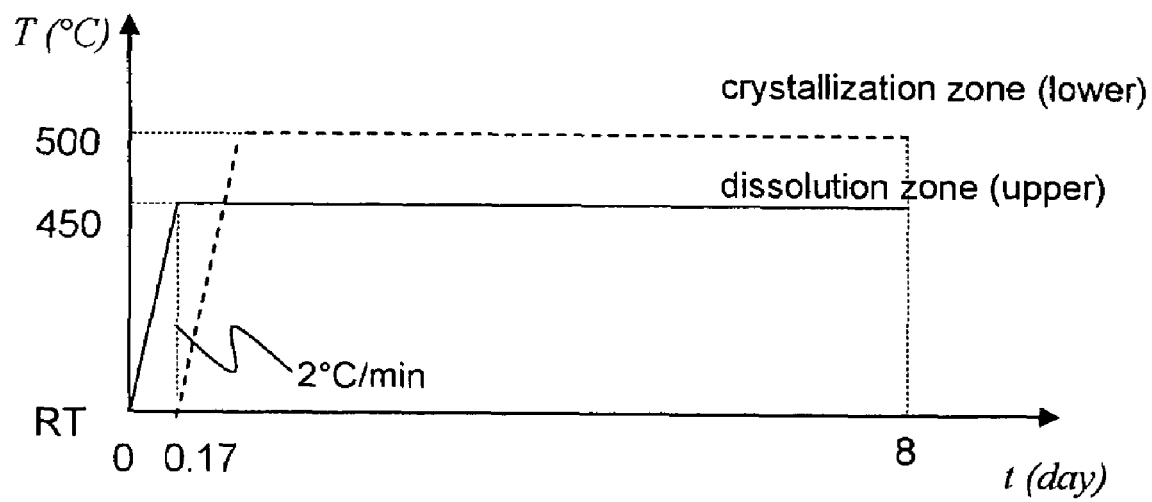
FIG. 5 shows the temporal change of temperature in another preferable embodiment of the process according to the invention (Example III).

In another example of this invention (Example III), illustrated in FIG. 5, modification is characterized in that the second step may start before the first step is finished, namely, when a portion of metallic gallium has not yet completely reacted with a supercritical ammonia-containing solvent. In this embodiment of the invention, heating of the crystallization zone of the autoclave begins soon after the constant temperature at the level of about 450° C. is attained in the dissolution zone. Chemical transport between the zones is then initiated, when most of metallic gallium has been transformed into polycrystalline gallium nitride, while the transition of metallic gallium to a solution continues for some time. In other respects, this example of the invention does not differ from the one described above.

Other preferable variants of the process for obtaining bulk mono-crystalline gallium-containing nitride according to the invention, including the three-step embodiment of the process as well as the use of composed mineralizers are presented in Example IV (three-step process), Examples V-VII (composed mineralizers). The use of mineralizer in the form of azide is illustrated in Examples VIII-XIII.

The bulk mono-crystalline gallium-containing nitride obtained in the process according to the invention has a very low dislocation density. The best substrate obtained by the method according to the invention has the surface dislocation density close to $10^4/cm^2$ with simultaneous half-width of X-ray rocking curve from (0002) plane below 60 arcsec (for Cu $K\alpha_1$). It may contain Group I elements in concentration of about 0.1 ppm or more than 0.1 ppm—over 1.0 ppm, or even more than 10 ppm of Group I elements. Moreover, even if the concentration of Group I elements is at the level of 500 ppm, the quality of the bulk mono-crystalline gallium-containing nitrides obtained in the process according to the invention is satisfactory. SIMS profiles (Secondary-Ion Mass Spectroscopy) for a product sample obtained directly through the process according to the invention show that Group I elements are present at the level of $10^6$ counts/s, which indicates that potassium is present in the order of about 500 ppm. Moreover, some transition metals (Fe, Cr, Ni, Co, Ti), present in the reaction environment, produce a measurable signal at least in the layer near the surface. To compare, analogical profiles for GaN seed crystal obtained by HPVE method show that potassium is present only at the level of about 1 ppm. Whereas, profiles of transition metals are at the level of noise, which proves that there is a very small amount of those elements in the seed crystal obtained by HPVE method.

Bulk mono-crystals of gallium-containing nitride obtained in the process according to the invention are subjected to special post-treatment, so that they can be used as substrates for epitaxy. The post-treatment consists of:

a) Slicing a bulk single crystal, preferably with a wire saw.

b) Rinsing the mono-crystalline gallium-containing nitride obtained from the supercritical solution, in various media, such as supercritical ammonia solution, water, or carbon dioxide, in order to remove impurities from the crystal.

c) Annealing the mono-crystalline gallium-containing nitride obtained from the supercritical solution, in the atmosphere of inert gas, optionally with an oxygen addition, at the temperature between approx. 600° C. and 1050° C., thus obtaining the material with better crystalline quality than before the annealing and/or activating the acceptors in the bulk gallium-containing nitride mono-crystal.

Slicing: usually a wire saw is used for slicing bulk crystals, but in order to use the wire saw the crystal's thickness should exceed 1 mm, preferably 3 mm. Due to the seed's flexion, the bulk mono-crystal obtained by the HVPE method on the sapphire substrate is not thick enough to be sliced with a wire saw. The method described in this application allows to obtain bulk mono-crystalline gallium nitride with high crystalline quality even if the mono-crystal's thickness does not exceed 1 mm, allowing it to be sliced into wafers. Moreover, the obtained bulk mono-crystalline gallium-containing nitride contains few impurities such as, e.g., oxygen, allowing it to be used in opto-electronic devices based on nitric semiconductors, such as laser diodes. The substrates obtained after slicing the crystal with a wire saw are then polished on both sides. Due to the fact that substrates are intended for the growth process from the gaseous phase, they are situated on a wire saw at an off-angle of between 0.05 and 0.2 degree with respect to the principal axis of the crystal. Since the bulk mono-crystals obtained from supercritical ammonia-containing solution contain, among others, impurities in the form of Group I elements, it is preferable to use the MOCVD method to form a buffer layer or a protective layer preventing the impurities from penetrating from the substrate obtained in the process described in this invention to the layers deposited on that substrate by epitaxial methods, e.g. the MOCVD method. This process is illustrated in Example XIV.

Rinsing: the rinsing process is illustrated in Example XV.

Annealing: bulk mono-crystalline gallium-containing nitride may be subjected to annealing in the atmosphere of inert gas, optionally with an oxygen addition, at the temperature between approx. 600° C. and 1050° C., thus obtaining the material with better crystalline quality than before the annealing. The annealing process allows to remove from the obtained bulk mono-crystalline gallium-containing nitride, at least in the near-surface layer, the impurities formed from the reactions carried out in the first step, such as hydrogen and ammonia, as well as ions from the impurities formed during crystallization and/or annealing. During the annealing process hydrogen, ammonia, and other ions formed during the growth processes, may undergo further changes favors their removal from the bulk crystalline gallium-containing nitride. Other impurities of the mono-crystalline gallium-containing nitride formed in the environment of the reactions which took place during the growth process, such as Group I elements or dopes of Group I elements, introduced to the system as a mineralizer, possibly with trace amounts of Group II elements, as well as other elements such as Ti, Fe, Co, Cr, and Ni from the apparata being used, are not removed in the annealing process.

Moreover, it is assumed that in the supercritical conditions the ammonia-containing solvent auto-dissociates into, among others, hydrogen ions ($H^+$) and amide ions ($NH_2^-$). In such case, in the supercritical dissociated solvent, acceptor ions may be incorporated into the structure of the mono-crystalline gallium-containing nitride. The acceptors in gallium-containing nitrides become passivated with hydrogen. They can be activated by the annealing process.

The above treatment is described in patent no. 5-183189 published in the *Japanese Patent Bulletin*. Typically, it can be carried out in the environment of hydrogen-free inert gas or in the environment of oxygen-containing inert gas. In such case, positive activation effects may be achieved with shorter annealing. Typically, in the process of annealing a furnace used for annealing semiconductors or an apparatus with an electron beam can be applied. The annealing process is illustrated in Examples XIV. Example XVI together with Example VI present the process in which annealing is used to activate the acceptors in the bulk mono-crystalline gallium-containing nitride.

The examples below illustrate this invention without limiting its scope.

EXAMPLE I

Two-step Process for Obtaining Bulk
Mono-crystalline Gallium Nitride

The high pressure autoclave I of the volume of 36.2 cm$^3$ was charged with 3.16 g (about 45 mmol) of the feedstock in the form of metallic gallium of 6N purity in its dissolution zone, and with three seed crystals in the form of gallium nitride obtained by the HVPE method, each about 200 μm thick and with the total surface area of 3.6 cm$^2$ in the crystallization zone. The autoclave was charged with 1.36 g (about 59 mmol) of metallic sodium (4N). Next, the autoclave was filled with 15.4 g of ammonia (5N), closed and put into the set of furnaces.

By slow heating (at 0.4° C./min) the temperature in the dissolution zone was raised to 450° C., maintaining at the same time the temperature at 250° C. in the crystallization zone. The temperature of 450° C. in the dissolution zone was attained after 1 day (FIG. 4). After the period of 3 days, when partial transition of gallium to a solution and a complete reaction of undissolved gallium to polycrystalline GaN took place, the temperature of the crystallization zone was raised (at about 2° C./min) to 500° C., with pressure inside the autoclave reaching about 260 MPa. Under those conditions (the second step of the process), the autoclave was maintained for the subsequent 8 days (FIG. 4). As a result of the process, partial dissolution of the feedstock (i.e. polycrystalline GaN) took place in the dissolution zone and crystallization of gallium nitride took place on the seeds in the form of two-sided mono-crystalline layers of about 220 μm of total thickness.

EXAMPLE II

Two-step Process for Obtaining Bulk
Mono-crystalline Gallium Nitride

The same procedures were followed as in Example I, with the only exception that instead of using 1.36 g of metallic sodium: a) 0.4 g of metallic lithium (4N) were used, b) 2.3 g of metallic potassium (4N) were used or c) 0.68 g of metallic sodium (4N) were used d) 1.92 g of sodium azide (4N) were used, and after 11 days of the process, growths of bulk mono-crystalline gallium-containing nitride layers were obtained of about a) 70 μm, b) 200 μm, c) 360 μm, and d) 400 μm, respectively.

EXAMPLE III

Two-step Process for Obtaining Bulk
Mono-crystalline Gallium Nitride

The same procedures were followed as in Example I, with the only exception that heating—beginning of the second step of the crystallization zone (at the rate of about 2° C./min)— was initiated when the dissolution zone attained the target temperature of 450° C., i.e. after the period of about 4 hours from the beginning of the process (FIG. 5). After another few hours, temperature in the crystallization zone attained 500° C. This state (i.e. 450° C. in the dissolution zone and 500° C. in the crystallization zone) was maintained till the end of the process. After 8 days, the growth, similar to that in Example I, of bulk mono-crystalline gallium-containing nitride layer was obtained.

EXAMPLE IV

Three-step Process for Obtaining Bulk
Mono-crystalline Gallium Nitride

The high pressure autoclave of 90 cm$^3$ volume was charged in the dissolution zone with 4.51 g (about 65 mmol) of the feedstock in the form of metallic gallium of 6N purity, and with 1.5 g (about 18 mmol) of the feedstock in the form of mono-crystalline gallium-containing wafers obtained by the HVPE method, whereas three seed crystals in the form of gallium nitride of about 200 μm thick each and total surface area of 1.9 cm$^2$ were placed in the crystallization zone. The autoclave was also charged with 5.9 g (about 151 mmol) of metallic potassium (4N). Next, the autoclave was filled with 39.3 g of ammonia (5N), closed and put into the set of furnaces.

Figure 6:
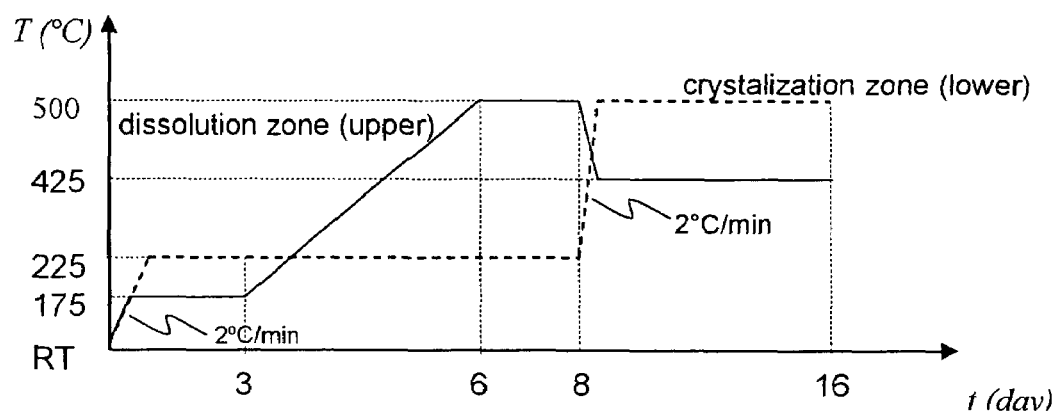
FIG. 6 shows the change of temperature in time inside the autoclave in Example IV.

By heating at 2° C./min, the temperature in the dissolution zone was raised to 175° C., while in the crystallization—to 225° C. This temperature set was maintained for the next three days (FIG. 6). During that time, the reaction of metallic gallium to a solution went to completion, while the feedstock in the form of mono-crystalline GaN deposited in the dissolution zone did not dissolve in significant degree, nor did the seeds placed in the crystallization zone. At the set temperatures, in the first step, there was practically no convection exchange of mass between the zones. In the second step of the process, the temperature in the dissolution zone was slowly— within 3 days (FIG. 6) raised to 500° C., and maintained at this level until the eight day of the process. The temperature in the crystallization zone was maintained at the unchanged level of 225° C. This enabled crystallization of gallium nitride from the supercritical solvent on the feedstock deposited in the dissolution zone. Seed crystals in the crystallization (lower) zone did not significantly dissolve. In the third step of the process, the temperature was gradient reversed (at approx. 2° C./min.) in the autoclave (the temperature in the dissolution zone was set at the level of 425° C., whereas in the crystallization zone at the level of 500° C.). Due to this, the process of dissolution of polycrystalline GaN was initiated in the dissolution zone, chemical transport of the material to the crystallization zone started, and crystallization of GaN took place on the seeds. In this step of the process the pressure inside the autoclave was about 260 MPa. In those conditions, the autoclave was maintained for the next 8 days (FIG. 6). As a result of the process, partial dissolution of the feedstock took place (i.e. complete dissolution of the layer obtained in the second step, and partial dissolution of mono-crystalline gallium-containing nitride introduced as the feedstock in the form of wafers crystallized by HVPE methods) in the dissolution zone, and crystallization of gallium nitride took place on the seeds with obtaining two-sided mono-crystalline layers of the total thickness of about 300 μm.

EXAMPLE V

Composed Mineralizer

The dissolution zone of a 600 cm$^3$ high pressure autoclave, having the inner diameter of 40 mm and length of 480 mm, was charged with 53.0 g of feedstock in the form of metallic gallium (6N). The crystallization zone of the same autoclave was charged with a seed crystal in the form of a gallium nitride wafer (having the diameter of about 1 inch and the mass of 2.0 g) obtained by the HVPE method. As the mineralizer, 12.0 g of 4N metallic sodium as well as 19.5 g of 4N metallic potassium were put into the autoclave. Next, the autoclave was filled with 255.0 g of ammonia (5N), tightly closed and put into a set of furnaces. The temperature of the dissolution zone was raised to 450° C. (at 1° C./min, FIG. 7), while the crystallization zone was not heated and its temperature did not exceed 250° C. In this way, supercritical ammonia-containing solution was obtained with the following molar ratio: $KNH_2:NH_3=0.035$; $NaNH_2:NH_3=0.035$. This temperature distribution was maintained in the autoclave for 4 days (FIG. 7), during which partial dissolution of gallium and a complete reaction of undissolved gallium to polycrystalline GaN took place.

Figure 7:
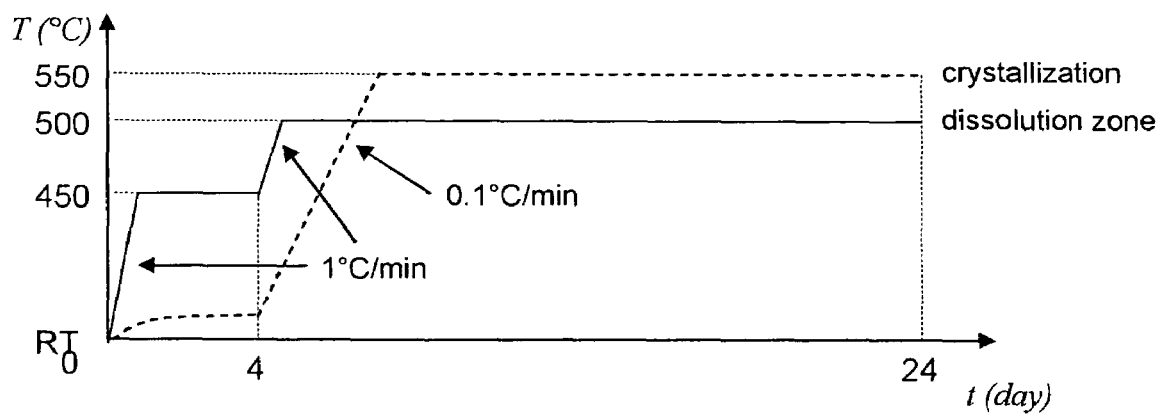
FIG. 7 shows the change of temperature in time inside the autoclave in Examples V and VI.

Next, the temperature of the dissolution zone was increased to 500° C. (at 1° C./min), the temperature of the crystallization zone was slowly increased to 550° C. (at 0.1° C./min, FIG. 7), with the pressure inside the autoclave reaching about 280 MPa. The autoclave was kept under those conditions (the second step of the process) for the subsequent 20 days (FIG. 7). As a result of the process, partial dissolution of the feedstock (i.e. polycrystalline GaN) was observed in the dissolution zone and crystallization of gallium nitride on the HVPE seed took place in the crystallization zone. The gallium nitride crystallized on both sides of the seed in the form of mono-crystalline layers with the total thickness of about 2 mm.

EXAMPLE VI

Composed Mineralizer

The same procedures were followed as in Example V, with the only exception that instead of using 12.0 g of metallic sodium and 19.5 g of metallic potassium—39.0 g of 4N metallic potassium together with 1.2 of 3N metallic magnesium were used, and after 24 days of the process growth of bulk mono-crystalline gallium-containing nitride layers was obtained of about 2 mm.

EXAMPLE VII

Composed Mineralizer

The high-pressure autoclave of the diameter of 40 mm, length of 480 mm and volume of 603 cm$^3$, was charged in the dissolution zone with the feedstock in the form of metallic gallium—53 g (about 750 mmol) and 6N purity, and was charged in the crystallization zone with the seed in the form of gallium nitride—at the weight of 0.74 g and diameter of 1 inch—obtained by the HVPE method. Also, 38 g (about 1000 mmol) of metallic potassium (4N) and 5g (50 mmol) of ZnS (4N) were introduced into the autoclave. Next, the autoclave was filled with 260 g of ammonia (5N), closed and put into the set of furnaces.

Figure 8:
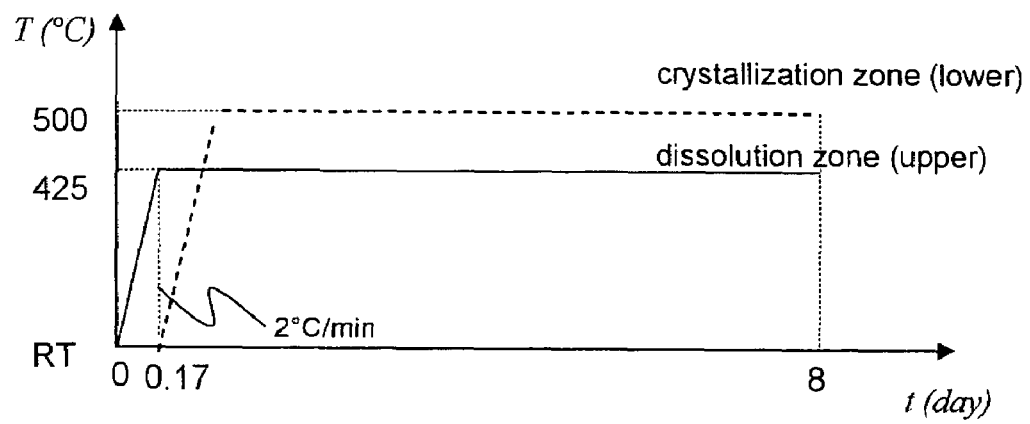
FIG. 8 shows the change of temperature in time inside the autoclave in Example VII.

By heating at 2° C./min, the temperature in the dissolution zone of the autoclave was raised to 425° C. (FIG. 8). Heating of the crystallization zone (at the rate of about 2° C./min) started when the dissolution zone attained the target temperature of 425° C./min, i.e., after the period of about 4 hours from the beginning of the process. After the next few hours temperature in the crystallization zone attained 500° C., with the pressure inside the autoclave being around 260 MPa. In this way, the supercritical ammonia-containing solution was obtained, in which the molar ratio of the mineralizer to ammonia was $KNH_2:NH_3=0.07$, whereas the molar ratio of S species to ions of Group I elements was 1:20. This balance (i.e., at 425° C. in the dissolution zone and 500° C. in the crystallization zone) remained till the end of the process, i.e. for about 8 days (FIG. 8).

As a result of the process, partial dissolution of the feedstock took place in the dissolution zone and crystallization of gallium nitride on the seed took place in the form of two-sided mono-crystalline layers of the total thickness of about 510 μm.

EXAMPLE VIII

Azide Mineralizer

Figure 9:
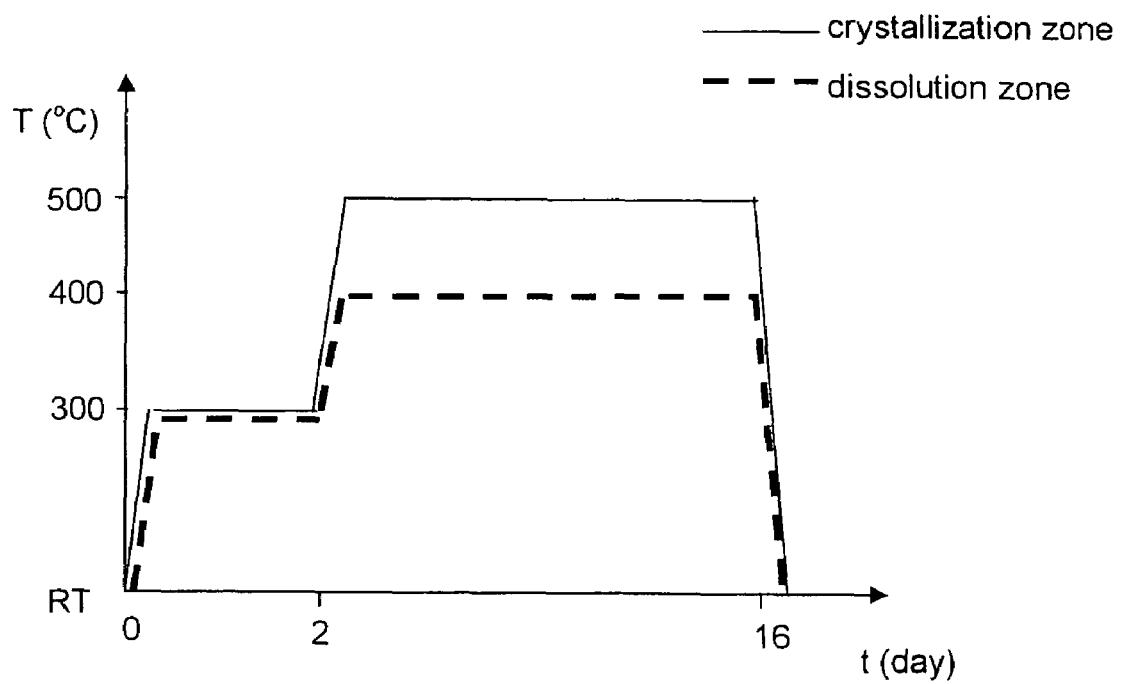
FIG. 9 shows the change of temperature in time inside the autoclave in Example VIII.

Dissolution zone of an 84 cm$^3$ high-pressure autoclave (FIGS. 1 and 2) was charged with 6.0 g of feedstock in the form of gallium nitride wafers obtained by HVPE method, each of 200 μm thickness as well as 0.27 g of 6N metallic gallium, and 0.5 g of GaN seeds obtained also by HVPE method were placed in the crystallization zone of the same autoclave. Then 9.8 g of 5N sodium azide and 39 g of 5N ammonia were placed in the autoclave. The autoclave was closed, put into the chamber of a furnace and heated up to 300° C. This temperature was maintained inside the autoclave for the next two days. During that time the azide was decomposed and the ammonobasic solvent was produced, which enabled complete dissolution of metallic gallium. After two days the temperature in the dissolution zone of the autoclave was increased to 400° C., while the temperature of the crystallization zone was increased to 500° C. This temperature distribution inside the autoclave was maintained for another 14 days (FIG. 9). At such conditions the expected pressure within the autoclave is ca. 230 MPa. The real pressure turned out to be ca. 330 MPa and the observed increment was the effect of gaseous nitrogen, produced during decomposition of the azide. As the result of the process, partial dissolution of the feedstock in the dissolution zone and growth of mono-crystalline gallium nitride layers on both sides of each seed in the crystallization zone was observed. The total thickness of the re-crystallized layers was ca. 800 μm.

EXAMPLE IX

Azide Mineralizer

Figure 10:
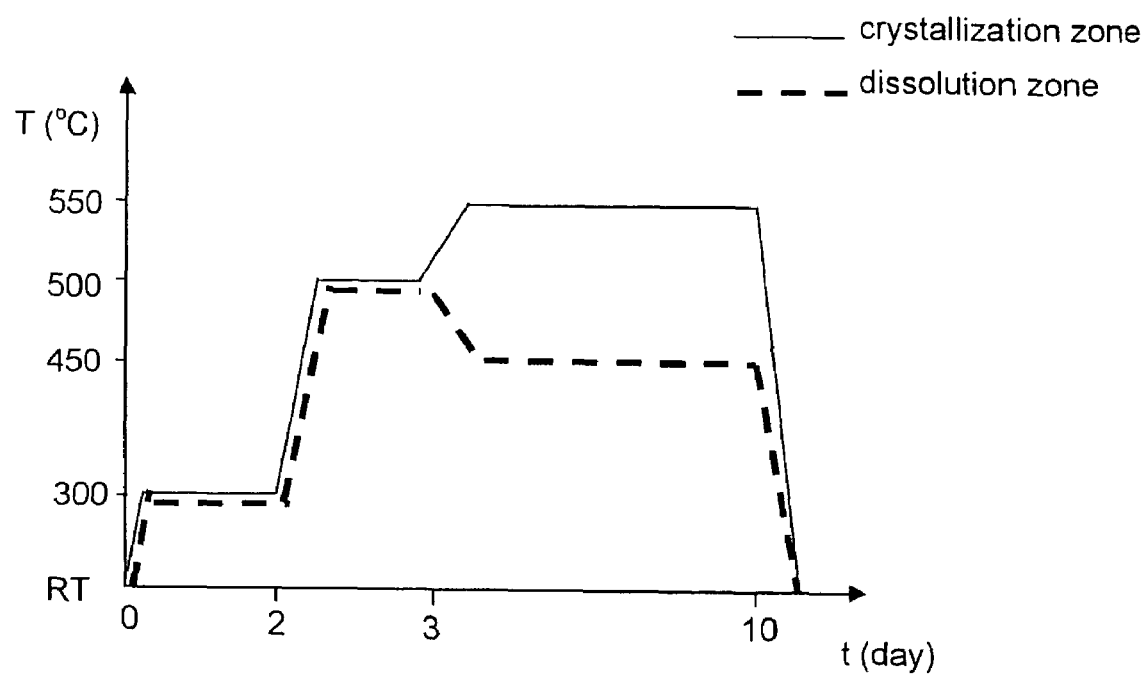
FIG. 10 shows the change of temperature in time inside the autoclave in Example IX.

Dissolution zone of an 84 cm$^3$ high-pressure autoclave (FIGS. 1 and 2) was charged with 6.0 g of feedstock in the form of gallium nitride wafers obtained by HVPE method, each of 200 μm thickness as well as 1.05 g of 6N metallic gallium, and 0.7 g of GaN seeds obtained also by HVPE method were placed in the crystallization zone of the same autoclave. Then 4.9 g of 5N sodium azide, 2.9 g of 4N metallic potassium and 3 g of 5N ammonia were placed in the autoclave. The autoclave was closed, put into the chamber of a furnace and heated up to 300° C. This temperature was maintained inside the autoclave for the next two days (FIG. 10). During that time the azide was decomposed and the ammonobasic solvent was produced, which enabled complete dissolution of metallic gallium. After two days the temperature in the autoclave was increased to 500° C. for one day. Then the temperature of the dissolution zone was decreased to 450° C., while the temperature of the crystallization zone was increased to 550° C. This temperature distribution inside the autoclave was maintained for another 7 days (FIG. 10). At such conditions the expected pressure within the autoclave is ca. 260 MPa. The real pressure turned out to be ca. 310 MPa and the observed increment was the effect of gaseous nitrogen, produced during decomposition of the azide. As the result of the process, partial dissolution of the feedstock in the dissolution zone and growth of mono-crystalline gallium nitride layers on both sides of each seed in the crystallization zone was observed. The total thickness of the re-crystallized layers was ca. 700 μm.

EXAMPLE X

Azide Mineralizer

Figure 11:
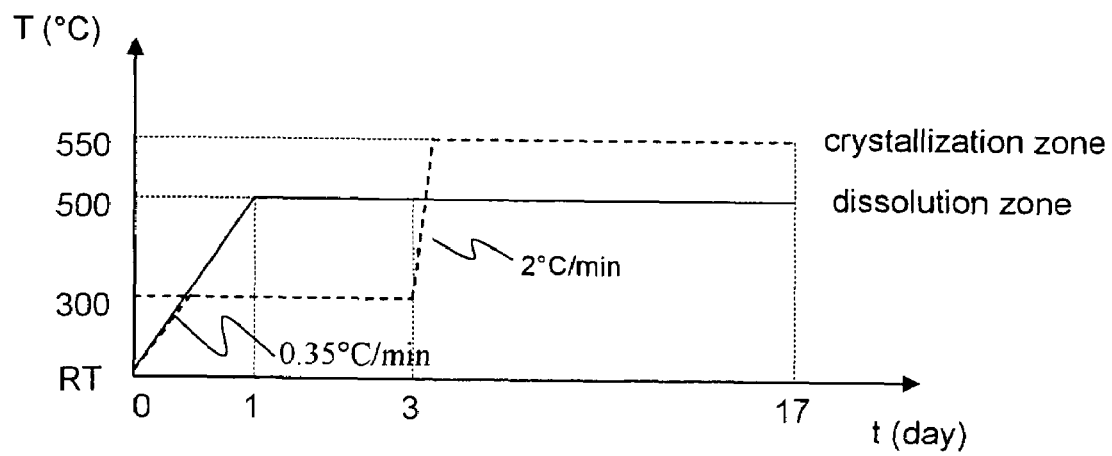
FIG. 11 shows the change of temperature in time inside the autoclave in Examples X-XII.

Dissolution zone of an 84 cm$^3$ high-pressure autoclave (FIGS. 1 and 2) was charged with 8.0 g of feedstock in the form of 6N metallic gallium, and 0.5 g of GaN seeds obtained also by HVPE method, each of ca. 250 μm thickness, were placed in the crystallization zone of the same autoclave. Then 4.9 g of 5N sodium azide and 38 g of 5N ammonia were placed in the autoclave. The autoclave was closed and put into the chamber of a furnace. The temperature in the dissolution zone of the autoclave was increased to 500° C. by slow heating (0.35° C./min), while the temperature in the crystallization zone was maintained at the level of 300° C. The target temperature of 500° C. in the dissolution zone was achieved in ca. 1 day (FIG. 11). This temperature distribution was maintained inside the autoclave for the next two days. During that time the azide was decomposed and the ammonobasic solvent was produced, which enabled partial dissolution of metallic gallium and the reaction of all non-dissolved gallium to polycrystalline GaN. After three days the temperature in the crystallization zone was increased (at 2° C./min) to 550° C. This temperature distribution inside the autoclave was maintained for another 14 days (FIG. 11). At such conditions the expected pressure within the autoclave is ca. 270 MPa. The real pressure turned out to be ca. 330 MPa and the observed increment was the effect of gaseous nitrogen, produced during decomposition of the azide. As the result of the process, partial dissolution of the feedstock (i.e. polycrystalline GaN) in the dissolution zone and growth of mono-crystalline gallium nitride layers on both sides of each seed in the crystallization zone was observed. The total thickness of the re-crystallized layers was ca. 1.6 mm.

EXAMPLE XI

Azide Mineralizer

Procedures as described in Examples VIII to X have been repeated except that seeds possessing surfaces susceptible to the lateral overgrowth (ELOG structures) were used. In our case, the ELOG structures had the form of ridges, ca. 10 μm high and 7 μm wide. Growth of mono-crystalline gallium nitride layers on the seeds in the crystallization zone was observed and the deposited GaN layers were of good crystalline quality.

EXAMPLE XII

Azide Mineralizer

Procedures as described in Examples VIII to X have been repeated except that a mixture of sodium azide and magnesium azide in the molar ratio of NaN$_3$:Mg(N$_3$)$_2$=20:1 was used. Similar results were obtained and bulk mono-crystals of GaN deposited on the seeds were of good quality.

EXAMPLE XIII

Azide Mineralizer

Figure 12:
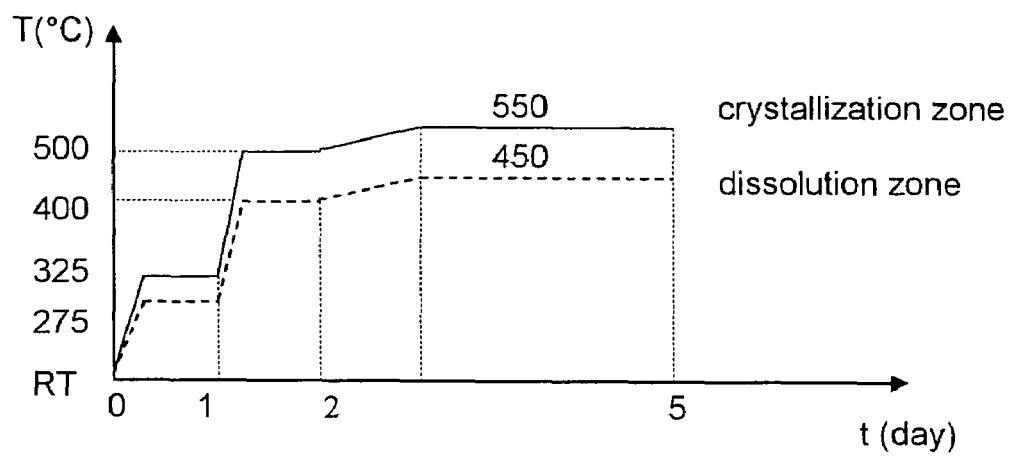

Dissolution zone of an 84 cm$^3$ high-pressure autoclave (FIGS. 1 and 2) was charged with 0.5 g of feedstock in the form of aluminum nitride tablet as well as 0.28 g of 6N metallic gallium, and 1.6 g of GaN seeds obtained also by HVPE method were placed in the crystallization zone of the same autoclave. Then 9.2 g of 4N sodium azide and 36.6 g of 5N ammonia were placed in the autoclave. The autoclave was closed, put into the chamber of a furnace and the temperature inside the autoclave was increased to 325° C. (in the crystallization zone) and to 275° C. (in the dissolution zone) for one day. The azide was decomposed and ammonobasic solvent was produced, which enabled total dissolution of metallic gallium. The temperature of the dissolution zone was then increased to 400° C., while the temperature of the crystallization zone was increased to 500° C. (FIG. 12). After another day the temperature was very slowly (at ca. 2° C./h) increased to 450° C. and 550° C. in the dissolution and crystallization zones respectively. At such conditions the expected pressure within the autoclave is ca. 260 MPa. The real pressure turned out to be ca. 360 MPa and the observed increment was the effect of gaseous nitrogen, produced during decomposition of the azide. At such conditions the autoclave was maintained for another two days (FIG. 12). As the result of the process, partial dissolution of the feedstock (i.e. the AlN tablet) in the dissolution zone and growth of mono-crystalline AlGaN layers on both sides of each seed in the crystallization zone was observed. The total thickness of the re-crystallized layers was ca. 10 μm. The deposited layers of mixed nitride were of good quality and two independent measurement techniques (SEM-EDX and X-ray diffraction) revealed that the composition of the layers was $Al_{0.2}Ga_{0.8}N$.

EXAMPLE XIV

Cutting and Annealing

Crystals obtained in similar ways as described above in Examples I-XIII were subjected to the following processes in order to use them as substrates:

1) The 5 mm mono-crystalline layer deposited on the seed with HVPE-GaN was placed in the furnace and subjected to annealing for between 1 to 5 hours in the nitrogen atmosphere containing low amounts of oxygen and in the temperature between 600° C. and 900° C.

2) Next, the sample was placed on a wire saw manufactured by the Takatori Corp. The sample was situated at an angle below 1 degree in order to give it the proper off-angle with respect to the principal axis of the crystal. Then, the sample was sliced into 5 wafers using a wire saw, thus obtaining samples with the off-angle of between 0.05 and 0.2 degrees.

3) Next, the samples were placed in the furnace and again subjected to annealing for between 1 and 5 hours in the nitrogen temperature containing low amounts of oxygen and in the temperature between 600° C. and 900° C. (Thus prepared samples are called: GaN substrates)

4) Next, GaN substrates were mounted on worktables, placed into a polishing machine manufactured by Logitech Ltd. and polished consecutively on both sides. In the polishing process diamond tools as well as silica, or alumina slurries (with pH from 3 to 6 or else from 9 to 11) were used. The roughness of the obtained surfaces was lower than 10 Å.

5) Next, a protective GaN or AlGaN layer (several-micron thick) was added to the surface of the GaN substrate using the HVPE method in the below specified conditions, thus obtaining the template-type substrate.

6) Optionally, on the GaN substrate with the afore-described protective layer, or on the GaN substrate without the protective layer, a 3 mm-thick GaN layer was created using the HVPE method. After slicing and polishing in accordance with the afore-described methods, a 0.5 mm-thick template-type substrate was obtained for use in opto-electronic devices.

EXAMPLE XV

Washing

Figure 13:
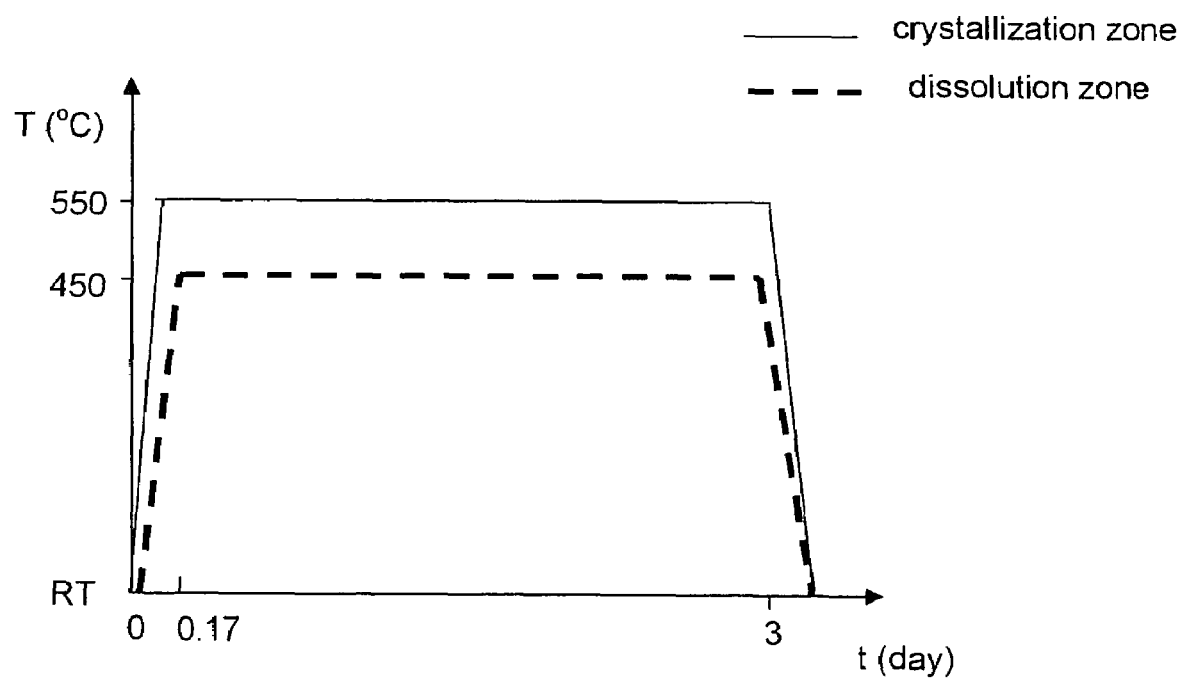
FIG. 13 shows the change of temperature in time inside the autoclave in Example XV.

Ten wafers with the diameter of 1 inch and weight of 15 g were placed in the high-pressure autoclave with the diameter of 40 mm, length 480 mm and the volume of 600 cm³ (FIGS. 1 and 2) in the form of GaN obtained by the growth method from the supercritical ammonia-containing solution. Next, 255.0 g of ammonia (5N) was introduced to the autoclave and the autoclave was tightly closed. The autoclave was then placed in the furnace system and the dissolution zone was heated up to the temperature of 450° C. and the crystallization zone up to the temperature of 550° C. Thus, the ammonia-containing solution was transferred into the supercritical state. After 3 days power was cut off from furnace. In those conditions autoclave was left to cool down by itself (FIG. 13). As a result of this process, the level of impurities in the substrate GaN layer marked as SIMS was considerably reduced.

Due to its high crystalline quality, the bulk mono-crystalline gallium-containing nitride obtained and post-treated by the method according to the invention, may be used as a substrate material for opto-electronic semiconductor devices based on nitrides, and in particular for laser diodes.

The above examples are intended to illustrate preferred embodiments of the process according to the present invention. Further modifications of the process can easily be designed by skilled artisans and such modifications are intended to be included within the scope of the present invention as defined in the appended claims.

The preferred embodiments according to the present invention are as follows.

1. The process of obtaining of mono-crystalline gallium-containing nitride from the gallium-containing feedstock in a supercritical ammonia-containing solvent with mineralizer addition, characterized in that the feedstock is in the form of metallic gallium and the mineralizer is in the form of elements of Group I (IUPAC, 1989) and/or their mixtures, and/or their compounds, especially those containing nitrogen and/or hydrogen, whereas the ammonia-containing solvent is in the form of the mineralizer and ammonia, there are two temperature zones in each step of the process, and the feedstock is placed in the dissolution zone, and at least one mono-crystalline seed is deposited in the crystallization zone, and following the transition of the solvent to the supercritical state, the process comprises the first step of transition of the feedstock from the metallic form to the polycrystalline gallium-containing nitride, and the second step of crystallization of the gallium-containing nitride through gradual dissolution of the feedstock and selective crystallization of gallium-containing nitride on at least one mono-crystalline seed at the temperature higher than that of the dissolution of the feedstock, while all the vital components of the reaction system (including the feedstock, seeds and mineralizer) invariably remain within the system throughout the whole process, and consequently bulk mono-crystalline gallium-containing nitride is obtained.

2. The process according to claim 1, characterized in that it is carried out in the closed system.

3. The process according to claim 1, characterized in that the gaseous components in the reaction system can be exchanged after the first step of the process.

4. The process according to claim 1, characterized in that the gallium-containing nitride has the general formula of $Al_xGa_{1-x}N$, where $0 \leq x < 1$.

5. The process according to claim 1, characterized in that hydrides, amides, imides, amido-imides, nitrides, azides or their mixtures are used as said compounds of Group I elements including nitrogen and/or hydrogen.

6. The process according to claim 1 or 2 or 3, characterized in that the ammonia-containing solvent produced contains ions of Group I element, preferably sodium and
   (a) ions of another Group I element or
   (b) ions of Group II elements, preferably calcium or magnesium or
   (c) one or more substances containing oxygen-free species causing the weakening of the ammono-basic nature of the supercritical solvent or
   (d) ions of Group II elements, preferably calcium or magnesium and one or more substances containing oxygen-free species causing the weakening of the ammono-basic nature of the supercritical solvent.

7. The process according to claim 1 or 2 or 3, characterized in that the mineralizer is in the form of azides of Group I elements.

8. The process according to claim 7, characterized in that said azides of Group I elements are $LiN_3$, $NaN_3$, $KN_3$, $CsN_3$ or their mixtures.

9. The process according to claim 7, characterized in that the molar ratio of the introduced azides of Group I elements to ammonia ranges from 1:200 to 1:2.

10. The process according to claim 1 or 2 or 3, characterized in that the dissolution zone is above the crystallization zone.

11. The process according to any one of the preceding claims 1-3, characterized in that convection and chemical transport between the two zones are suppressed in the first step, and the saturation degree of the supercritical solution with respect to soluble gallium compounds is reduced.

12. The process according to claim 11, characterized in that the reduction of the saturation degree of the supercritical solution with respect to soluble gallium compounds is obtained by adjusting the opening of the crucibles containing metallic gallium, placed in the dissolution zone.

13. The process according to claim 11, characterized in that the temperature ramping in the dissolution zone at the beginning of the first step is higher than 0.1° C./min, and then the temperature in the first step in the dissolution zone is maintained higher than 350° C., preferably higher than 400° C.

14. The process according to claim 11, characterized in that the temperature maintained in the first step in the crystallization zone causes that the seeds do not dissolve or dissolve in negligible degree.

15. The process according to claim 11, characterized in that the temperature in the dissolution zone is maintained higher than the temperature in the crystallization zone in the first step, and in the second step the temperature in the crystallization zone is raised to a higher value than the temperature in the dissolution zone.

16. The process according to claim 15, characterized in that the temperature in the first step in the crystallization zone is not higher than 500° C., preferably not higher than 400° C., most preferably not higher than 300° C.

17. The process according to any one of the preceding claims 1-3, characterized in that the temperature gradient between the zones at the beginning of the second step is reversed and mass transport by convection takes place between the zones.

18. The process according to claim 17, characterized in that the temperature ramping in the crystallization zone at the beginning of the second step enables a certain dissolution of the seed(s).

19. The process according to claim 17, characterized in that the second step begins when the first step is not yet completed.

20. The process according to claim 17, characterized in that in the second step the temperature in the dissolution zone is maintained lower than the temperature in the crystallization zone.

21. The process according to claim 20, characterized in that the temperature in the second step in the crystallization zone is not lower than 350° C., preferably not lower than 400° C., most preferably ranges between 500° C. and 550° C.

22. The process according to claim 20, characterized in that the mineralizer is introduced into the autoclave and next the feedstock in the form of metallic gallium is placed in the dissolution zone of the autoclave, and at least one seed is mounted in the crystallization zone of the autoclave, and then the autoclave is filled with ammonia;

next, in the first step, transition of the solvent to the supercritical state takes place, while temperatures in both zones are maintained different by gradual and selective increase of the temperature in the dissolution zone in order to obtain at least partial reaction between metallic gallium and the supercritical solvent, and at the same time the temperature is maintained in the crystallization zone at which dissolution of seed(s) takes place in negligible degree;

next, the temperature is raised in the dissolution zone to the value at which the polycrystalline form of gallium-containing nitride is obtained, and the temperature is maintained in the crystallization zone at which seeds dissolve at negligible rate;

after polycrystalline gallium-containing nitride is obtained, at least partially, in the dissolution zone, the average temperature of the crystallization zone is increased to the value higher than the average temperature in the dissolution zone, chemical transport by convection is evoked and re-crystallization of gallium-containing nitride is carried out on the seed(s).

23. The process of controlling the growth rate of the bulk mono-crystalline gallium-containing nitride in the process according to any one of the preceding claims 1-3, characterized in that the process comprises the first step of transition of the feedstock from the metallic form to polycrystalline gallium-containing nitride, while convection and chemical transport are suppressed, and then the second step in which the conditions of dissolution of the feedstock and the saturation degree of the supercritical solution with respect to soluble gallium compounds are controlled, and after convection is evoked, the feedstock gradually dissolves and selective crystallization of gallium nitride on at least one mono-crystalline seed is carried out at the temperature higher than that for the dissolution of the feedstock, as long as the feedstock has completely or partially run out, and bulk mono-crystalline gallium-containing nitride is obtained.

24. The process according to claim 23, characterized in that the dissolution rate of the feedstock in the second step is controlled depending on pressure and temperature of the process through selection of the mineralizer from the Group I elements, including lithium, sodium, potassium and their mixtures and compounds, especially those containing nitrogen and/or hydrogen.

25. The process according to claim 24, characterized in that a preferable molar ratio of the mineralizer to ammonia is used according to the set conditions of the process.

26. The process according to claim 23, characterized in that the dissolution rate of the feedstock in the second step is controlled through adjusting the opening degree of crucibles containing the polycrystalline gallium-containing nitride in the dissolution zone.

27. The process according to claim 23, characterized in that solubility of the feedstock increases in the second step through a decrease of the temperature in the dissolution zone.

28. The process according to claim 23, characterized in that convection is controlled through temperature difference between the zones.

29. The process according to claim 23, characterized in that convection is controlled through controlling the position of the zones with respect to each other.

30. The process according to claim 23, characterized in that convection in the second step is controlled through controlling the opening of the baffle or baffles separating the two zones.

31. The process according to claim 23, characterized in that concentration of soluble gallium-containing compounds in the supercritical solution in the crystallization zone in the second step increases until it attains minimal supersaturation degree with respect to gallium nitride through an increase of the temperature in the crystallization zone.

32. The process according to claim 31, characterized in that supersaturation of the supercritical solution with respect to gallium nitride increases in the crystallization zone through an increase of the temperature in that zone.

33. The process of forming a substrate from bulk mono-crystalline gallium-containing nitride obtained by a method according to any one of the preceding claims 1-3, characterized in that the thus obtained bulk mono-crystalline gallium-containing nitride layer is then sliced and polished.

34. The process according to claim 33, characterized in that the bulk mono-crystalline gallium-containing nitride layer crystallized on the seed has the thickness of over 1 mm, preferably over 3 mm.

35. The process according to claim 33, characterized in that a protective layer is deposited on the thus obtained substrate by the crystallization method from the gaseous phase, preferably using the MOCVD or HVPE method.

36. The process according to claim 35, characterized in that a protective layer from $Al_xGa_{1-x}N$, where $0 \leq x < 1$, is deposited on the thus obtained substrate.

37. The process for reducing the level of impurities in bulk mono-crystalline gallium-containing nitride obtained by a method according to any one of the preceding claims 1-3, characterized in that the thus obtained bulk mono-crystalline gallium-containing nitride is subjected to annealing in the atmosphere of inert gas, possibly with an addition of oxygen, at temperature between approx. 600 and 1050° C., thus producing material with higher crystalline quality than before the annealing.

38. The process according to claim 37, characterized in that nitrogen and/or argon serve as inert gas.

39. The process according to claim 37 or 38, characterized in that annealing is carried out in the atmosphere of inert gas with an addition of oxygen between 10 and 30 vol. %.

40. The process according to claim 37, characterized in that the annealing process is carried out in a single step or in multiple steps until the desired level of impurities (such as hydrogen and/or ammonia or ions formed from the impurities formed during the crystallization and/or annealing process) is reached.

41. The process for removing impurities from bulk mono-crystalline gallium-containing nitride obtained by a method according to any one of the preceding claims 1-3, characterized in that the thus obtained mono-crystalline layer of bulk gallium-containing nitride has the thickness of over 1 mm, preferably over 3 mm, and then the layer is sliced into wafers which are
   (a) rinsed in the environment of supercritical ammonia-containing solvent, water or carbon dioxide or
   (b) rinsed in the environment of liquid ammonia-containing solvent, water or carbon dioxide or
   (c) subject to the action of gaseous hydrogen, nitrogen or ammonia with at least some impurities being washed off from the mono-crystalline nitride.

42. The process according to claim 41, characterized in that the process for removing impurities by
   (a) rinsing in the environment of supercritical ammonia-containing solvent, water or carbon dioxide or
   (b) rinsing in the environment of liquid ammonia-containing solvent, water or carbon dioxide
   is aided by the application of ultrasounds.

43. The process according to claim 41, characterized in that the process for removing impurities in the gaseous hydrogen, nitrogen or ammonia is aided by exposure to an electron beam.

44. The process according to any one of the preceding claims 33 or 41-43, characterized in that a wire saw is used for slicing bulk mono-crystalline gallium-containing nitride.

45. The process according to claim 6, characterized in that the ammonia-containing solvent produced contains at least ions of Group I elements and ions of acceptors (Group II and Group IV, IUPAC 1989) and the thus obtained bulk mono-crystalline gallium-containing nitride is annealed in the atmosphere that does not contain hydrogen but does contain oxygen.

46. The process according to claim 6, characterized in that elements such as magnesium (Mg), zinc (Zn) or cadmium (Cd) serve as acceptors.

47. The process of obtaining a bulk mono-crystalline gallium-containing nitride from the gallium-containing feedstock in a supercritical ammonia-containing solvent characterized in that the feedstock is in the form of metallic gallium or mono-crystalline gallium-containing nitride, and the ammonia-containing solvent is in the form of ammonia with addition of mineralizer in the form of the Group I (IUPAC, 1989) elements and/or their mixtures, and/or their compounds, especially those containing nitrogen and/or hydrogen, there are two temperature zones in each step of the process, and the feedstock is placed in the dissolution zone and at least one mono-crystalline seed is deposited in the crystallization zone, and following the transition of the solvent to the supercritical state, the process comprises the first step of transition of metallic gallium to the solution at the first temperature, and then the second step of selective crystallization of gallium nitride on the feedstock in the form of mono-crystalline gallium-containing nitride, and then the third step of crystallization of the gallium nitride, through gradual dissolution of the feedstock and selective crystallization of gallium-containing nitride on at least one seed at the temperature higher than that of the dissolution of the feedstock, while all the vital components of the reaction system (including the feedstock, seeds and mineralizer) invariably remain within the system throughout the whole process, and subsequently bulk mono-crystalline gallium-containing nitride is obtained.

48. The process according to claim 47, characterized in that it is carried out in the closed system.

49. The process according to claim 47, characterized in that the gaseous components in the reaction system can be exchanged after the first step of the process.

What is claimed is:
1. A process of obtaining a mono-crystalline gallium-containing nitride with a supercritical solution formed by dissolving a gallium-containing feedstock in a supercritical ammonia-containing solvent with addition of a mineralizer, the process comprising:
   forming a polycrystalline gallium-containing nitride feedstock in a reaction vessel, the reaction vessel comprising a dissolution zone in which a metallic gallium feedstock is placed and a crystallization zone in which at least one seed is placed,
   wherein the polycrystalline gallium-containing nitride feedstock is formed from the metallic gallium feedstock by suppressing convection and chemical transport between the dissolution zone and the crystallization zone and by reacting the metallic gallium feedstock with a supercritical ammonia-containing solvent; and
   crystallizing a gallium-containing nitride by gradual dissolution of the polycrystalline gallium-containing nitride feedstock by evoking convection and chemical transport and by selective crystallization of gallium-containing nitride on the at least one seed to obtain a bulk mono-crystalline gallium-containing nitride.

2. The process according to claim 1, wherein the mineralizer is $LiN_3$, $NaN_3$, $KN_3$, $CsN_3$ or mixtures thereof.

3. The process according to claim 1, wherein a saturation degree of the supercritical solution with respect to soluble gallium compounds is controlled by adjusting an opening of a crucible containing the metallic gallium feedstock placed in the dissolution zone.

4. The process according to claim 1, wherein a temperature ramping in the dissolution zone to begin the forming of the polycrystalline gallium-containing nitride feedstock is higher than 0.1 0° C./min, and a temperature in the dissolution zone is subsequently maintained higher than 350° C. during the forming of the polycrystalline gallium-containing nitride feedstock.

5. The process according to claim 1, wherein the temperature in the dissolution zone is maintained higher than the temperature in the crystallization zone during the forming of the polycrystalline gallium-containing feedstock, and the temperature in the crystallization zone is raised to a higher value than the temperature in the dissolution zone during the crystallizing of the gallium-containing nitride.

6. The process according to claim 1, wherein a temperature ramping in the crystallization zone to begin the crystallizing of the gallium-containing nitride enables a dissolution of the at least one seed.

7. A process of forming a substrate from a bulk mono-crystalline gallium-containing nitride, comprising:
   obtaining a bulk mono-crystalline gallium-containing nitride by the process of claim 1; and
   slicing and polishing the bulk mono-crystalline gallium-containing nitride to obtain a substrate.

8. The process according to claim 7, wherein the bulk mono-crystalline gallium-containing nitride crystallized on the seed has a thickness of over 1 mm.

9. The process according to claim 7, further comprising depositing a protective layer on the the substrate using a MOCVD or HVPE method.

10. The process according to claim 9, wherein the protective layer comprises $Al_xGa_{1-x}N$, where $0 \leqq x < 1$.

11. The process according to claim 7, wherein a wire saw is used for slicing the bulk mono-crystalline gallium-containing nitride.

12. A process for removing impurities from a bulk mono-crystalline gallium-containing nitride, comprising:
   obtaining a bulk mono-crystalline gallium-containing nitride by the process of claim 1, wherein the obtained bulk mono-crystalline gallium-containing nitride has a thickness of over 1 mm;
   slicing the bulk mono-crystalline gallium-containing nitride into a wafer; and removing at least some impurities from the wafer by:
      (a) rinsing in an environment of supercritical ammonia-containing solvent, water or carbon dioxide; or
      (b) rinsing in an environment of liquid ammonia-containing solvent, water or carbon dioxide; or
      (c) subjecting to an action of gaseous hydrogen, nitrogen or ammonia.

13. The process according to claim 12, wherein the removing of impurities involves
   the (a) rinsing in the environment of supercritical ammonia-containing solvent, water or carbon dioxide, aided by an application of ultrasounds, or
   the (b) rinsing in the environment of liquid ammonia-containing solvent, water or carbon dioxide, aided by an application of ultrasounds.

14. The process according to claim 1, wherein said convection and chemical transport are controlled through a temperature difference between the dissolution zone and the crystallization zone.

15. The process according to claim 1, wherein the dissolution zone is above the crystallization zone.

16. A process for reducing a level of impurities in a bulk mono-crystalline gallium-containing nitride obtained by the process according to claim 1, wherein the obtained bulk mono-crystalline gallium-containing nitride is subjected to annealing in an atmosphere of inert gas at a temperature between 600° C. and 1050° C.

17. The process according to claim 16, wherein said annealing is carried out in the atmosphere of inert gas with an addition of oxygen.

18. The process according to claim 16, wherein the obtained bulk mono-crystalline gallium-containing nitride is doped with accepters, and said accepters are activated through said annealing.

19. The process according to claim 1, wherein, during the crystallizing of the gallium-containing nitride from the polycrystalline gallium-containing nitride feedstock, a temperature of the selective crystallization of gallium-containing nitride on the at least one seed is higher than a temperature of the gradual dissolution of the polycrystalline gallium-containing nitride feedstock.

20. A process of obtaining a bulk mono-crystalline gallium-containing nitride from a supercritical solution formed by dissolving a gallium-containing feedstock in a supercritical ammonia-containing solvent with addition of a mineralizer, the process comprising:
   forming a supereritical solution from a feedstock in a form of metallic gallium in a reaction vessel having a dissolution zone in which the feedstock in the form of metallic gallium and a feedstock in a form of crystalline gallium-containing nitride are placed and a crystallization zone in which at least one seed is placed, by suppressing convection and chemical transport between the dissolution zone and the crystallization zone and by dissolving the feedstock in the form of metallic gallium in a supercritical ammonia-containing solvent;
   selectively crystallizing gallium-containing nitride on the feedstock in the form of crystalline gallium-containing nitride from the supercritical solution; and
   crystallizing a gallium-containing nitride, through gradual dissolution of the feedstock in the form of crystalline gallium-containnig nitride, by evoking convection and chemical transport and by selective crystallization of gallium-containing nitride on the at least one seed in the crystallization zone to obtain a bulk mono-crystalline gallium-containing nitride.

21. The process according to claim 20, wherein, during the crystallizing of a gallium-containing nitride through gradual dissolution of the feedstock in the form of crystalline gallium-containing nitride, a temperature of the selective crystallization of gallium-containing nitride on the at least one seed is higher than a temperature of the dissolution of the feedstock in the form of crystalline gallium-containing nitride.

* * * * *